(12) United States Patent
Koyama

(10) Patent No.: US 6,809,482 B2
(45) Date of Patent: Oct. 26, 2004

(54) LIGHT EMITTING DEVICE AND METHOD OF DRIVING THE SAME

(75) Inventor: Jun Koyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 107 days.

(21) Appl. No.: 10/159,004

(22) Filed: May 31, 2002

(65) Prior Publication Data

US 2002/0196389 A1 Dec. 26, 2002

(30) Foreign Application Priority Data

Jun. 1, 2001 (JP) ........................................ 2001-166739

(51) Int. Cl.[7] .............................. G09G 3/10; G09G 3/30; G02F 1/1335
(52) U.S. Cl. ................................ 315/169.3; 315/169.4; 345/77; 349/69
(58) Field of Search .......................... 315/169.1, 169.3, 315/169.4, 169.2, 170; 345/55, 56, 82, 92, 77; 349/69

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |

(List continued on next page.)

FOREIGN PATENT DOCUMENTS

| | | |
|---|---|---|
| EP | 717 448 A2 | 6/1996 |
| EP | 776 147 A1 | 5/1997 |
| EP | 0 778 556 | 6/1997 |
| EP | 1 061 497 | 12/2000 |
| EP | 1 107 220 | 6/2001 |
| GB | 2 336 459 | 10/1999 |
| JP | 08-078159 | 3/1996 |
| JP | 08-241048 | 9/1996 |
| JP | 090148066 | 6/1997 |
| JP | 10-092576 | 4/1998 |
| JP | 10-189525 | 7/1998 |
| JP | 10-214060 | 8/1998 |
| JP | 10-247735 | 9/1998 |
| JP | 10-0232649 | 9/1998 |
| JP | 10-312173 | 11/1998 |
| JP | 2000-221942 | 8/2000 |
| JP | 2000-235370 | 8/2000 |
| JP | 2000-347621 | 12/2000 |
| JP | 2001-042822 | 2/2001 |
| JP | 2001-060076 | 3/2001 |
| WO | WO 90/13148 | 11/1990 |
| WO | WO 98/48403 | 10/1998 |
| WO | WO 99/42983 | 8/1999 |
| WO | WO 99/49989 | 10/1999 |
| WO | WO 99/53472 | 10/1999 |

OTHER PUBLICATIONS

Tsutsui, T. et al, 'Electroluminescence in Organic Thin Films,' Photochemical Processes in Organized Molecular Systems, pp. 437–450, Elsevier Science Publishers, Tokyo, 1991.

(List continued on next page.)

Primary Examiner—James Clinger
Assistant Examiner—Chuc Tran
(74) Attorney, Agent, or Firm—Cook, Alex, McFarron, Manzo, Cummings & Mehler, Ltd.

(57) ABSTRACT

An electrooptical device is provided in which lowering of the frequency characteristic due to a large power external switch connected to an opposite electrode is prevented to avoid reduction in number of gray scales. In an electrooptical device having a plurality of source signal lines, a plurality of gate signal lines, a plurality of power supply lines, a plurality of power controlling lines, and a plurality of pixels, each of the plural pixels has a switching TFT, an EL driving TFT, a power controlling TFT, and an EL element, and the power controlling TFT controls the difference in electric potential between an anode and cathode of the EL element.

38 Claims, 22 Drawing Sheets

U.S. PATENT DOCUMENTS

| | | | | |
|---|---|---|---|---|
| 4,720,432 | A | | 1/1988 | VanSlyke et al. ............ 428/457 |
| 4,769,292 | A | | 9/1988 | Tang et al. .................. 428/690 |
| 4,885,211 | A | | 12/1989 | Tang et al. .................. 428/457 |
| 4,950,950 | A | | 8/1990 | Perry et al. .................. 313/504 |
| 5,047,687 | A | | 9/1991 | VanSlyke ..................... 313/503 |
| 5,059,861 | A | | 10/1991 | Littman et al. .............. 313/503 |
| 5,059,862 | A | | 10/1991 | VanSlyke et al. ............ 313/503 |
| 5,061,617 | A | | 10/1991 | Maskasky .................... 430/569 |
| 5,073,446 | A | | 12/1991 | Scozzafava et al. ......... 428/323 |
| 5,151,629 | A | | 9/1992 | VanSlyke ..................... 313/504 |
| 5,247,190 | A | | 9/1993 | Friend et al. .................. 257/40 |
| 5,294,869 | A | | 3/1994 | Tang et al. .................. 313/504 |
| 5,294,870 | A | | 3/1994 | Tang et al. .................. 313/504 |
| 5,399,502 | A | | 3/1995 | Friend et al. ................... 437/1 |
| 5,641,991 | A | | 6/1997 | Sakoh ......................... 257/755 |
| 5,714,968 | A | * | 2/1998 | Ikeda ........................... 345/77 |
| 5,839,456 | A | | 11/1998 | Han ........................ 134/104.1 |
| 5,882,761 | A | | 3/1999 | Kawami et al. ............... 428/69 |
| 5,990,629 | A | | 11/1999 | Yamada et al. ........... 315/169.3 |
| 6,011,529 | A | * | 1/2000 | Ikeda ........................... 345/77 |
| 6,087,245 | A | | 7/2000 | Yamazaki et al. ........... 438/486 |
| 6,165,824 | A | | 12/2000 | Takano et al. ............... 438/160 |
| 6,229,506 | B1 | * | 5/2001 | Dawson et al. ............... 345/82 |
| 6,236,064 | B1 | | 5/2001 | Mase et al. .................... 257/72 |
| 6,246,180 | B1 | | 6/2001 | Nishigaki ................. 315/169.3 |
| 6,246,384 | B1 | | 6/2001 | Sano ............................ 345/76 |
| 6,366,025 | B1 | | 4/2002 | Yamada ................... 315/169.3 |
| 6,433,485 | B2 | * | 8/2002 | Tai et al. .................. 315/169.2 |
| 6,440,877 | B1 | * | 8/2002 | Yamazaki et al. ........... 438/780 |
| 6,528,950 | B2 | * | 3/2003 | Kimura ................... 315/169.3 |
| 2001/0002703 | A1 | | 6/2001 | Koyama ........................ 257/40 |
| 2003/0016190 | A1 | * | 1/2003 | Kondo |

OTHER PUBLICATIONS

Baldo, M.A. et al, 'Highly Efficient Phosphorescent Emission from Organic Electroluminescent Devices,' Nature, vol. 395, pp. 151–154, Sep. 10, 1998.

Baldo, M.A. et al, 'Very High–Efficiency Green Organic Light–Emitting Devices Based on Electrophosphorescence,' Applied Physics Letters, vol. 75, No. 1, pp. 4–6, Jul. 5, 1999.

Tsutsui, T. et al, 'igh Quantum Efficiency in Organic Light–Emitting Devices with Iridium–Complex as a Triplet Emissive Center,' Japanese Journal of Applied Physics, vol. 38, part 2, no, 12B, pp. L1502–L1504, Dec. 15, 1999.

English Abstract re Japanese Patent Application No. JP 2000–221942 published Aug. 11, 2000.

English Abstract re Japanese Patent Application No. JP 2000–235370 published Aug. 29, 2000.

Full English translation re Japanese Patent Application No. JP 2000–347621 published Dec. 15, 2000.

Full English translation re Japanese Patent Application No. JP 2001–042822 published Feb. 16, 2001.

English abstract re Japanese Patent Application No. JP 2001–060076 published Mar. 6, 2001.

Kanagu, S. et al, "A 31–in. Diagonal Full–Color Surface–Discharge ac Plasma Display Display Panel," SID 92 Digest, pp. 713–716, May 17, (1992).

Kawahara, I. et al, "Simulation of Motion Picture Disturbance for AC–PDP Modeling Virtual Pixel on Retina," IEICE Transactions on Electronics, vol. E81 C., No. 11, pp. 1733–1739, Nov. (1998).

Zou, D. et al, "Improvement of Current–Voltage Characteristics in Organic Lighting Diodes by Application of Reversed–Bias Voltage," Jpn. Appl. Phys., vol. 37, Part 2, No. 11B pp. L1406–L1408, Nov. 15, (1998).

Schenk, H. et al, "Polymers for Light Emitting Diodes," EuroDisplay '99, Proceedings of the 19th International Display Research Conference, Berlin, Germany, Sep. 6–9, 1999, pp. 37–37 (1999).

* cited by examiner

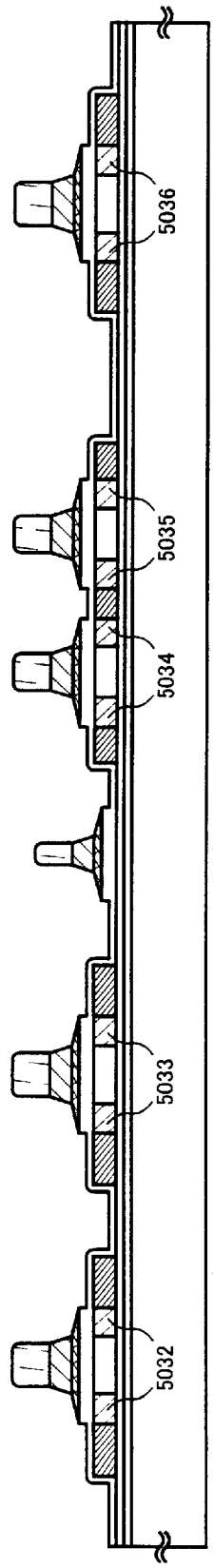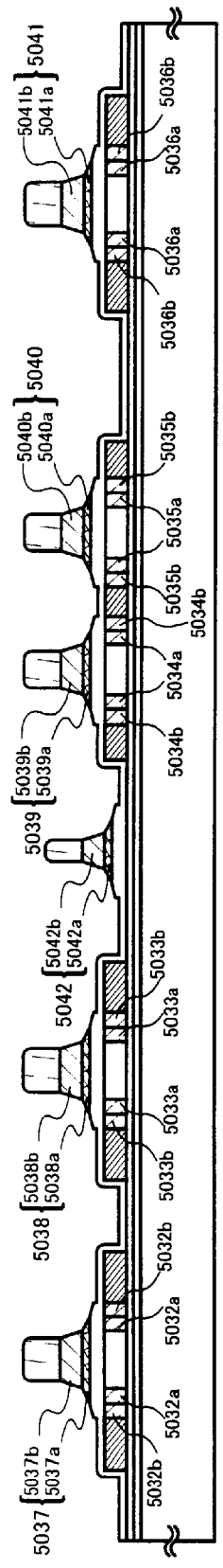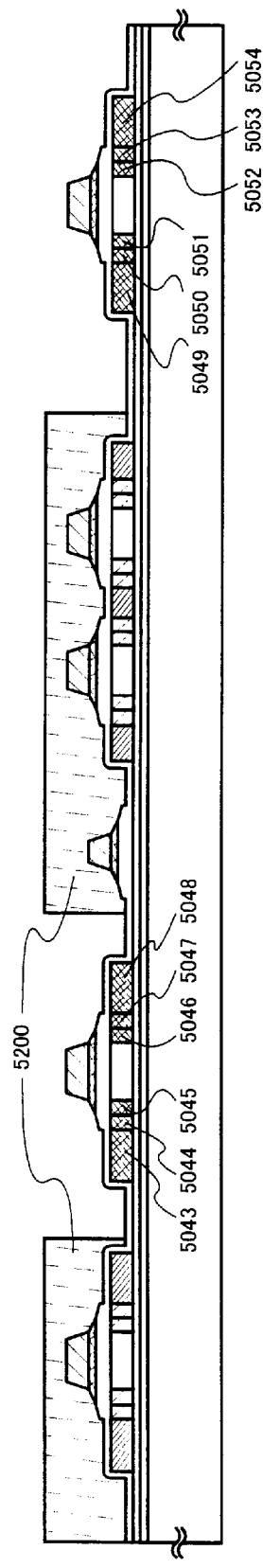
FIG. 11A
FIG. 11B
FIG. 11C

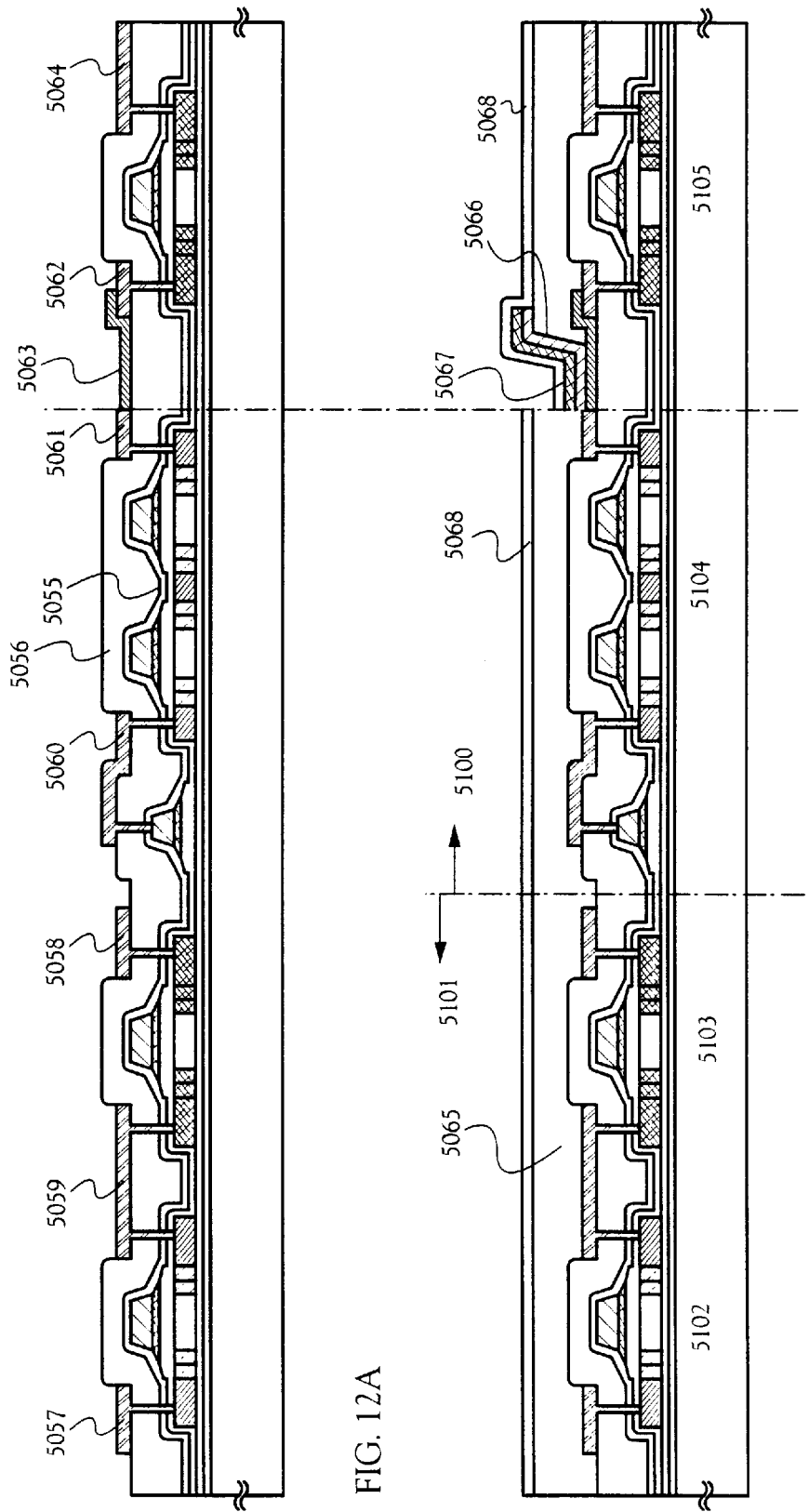

LIGHT EMITTING DEVICE AND METHOD OF DRIVING THE SAME

BACKGROUND OF THE INVENTION

1. Field of the Invention

The present invention relates to an OLED (organic light emitting device) panel in which a light emitting element such as an OLED formed on a substrate is sealed between the substrate and a cover member, and to a method of driving the OLED panel. The invention also relates to an OLED module obtained by mounting an IC that includes a controller to the OLED panel. In this specification, a light emitting device is used as the generic term for the OLED panel and the OLED module. Also included in the present invention is electronic equipment using the light emitting device.

2. Description of the Related Art

In recent years, a technique of forming a TFT on a substrate has made great advancement to promote application of TFTs to active matrix display devices. In particular, TFTs using polysilicon have higher field effect mobility (also called mobility) than conventional TFTs that use amorphous silicon and therefore can operate at high speed. This makes it possible to control pixels, which has conventionally been controlled by a driving circuit external to the substrate, by a driving circuit formed on the same substrate on which the pixels are formed.

With various circuits and elements formed on the same substrate, active matrix display devices can have many advantages including lowering of manufacture cost, reduction in display device size, an increase in yield, and improvement in throughput.

An active matrix light emitting device having an OLED as a self-luminous element (hereinafter simply referred to as light emitting device) is being researched actively. A light emitting device is also called as an organic EL display (OELD) or an organic light emitting diode (OLED).

Being self-luminous, an OLED does not need back light which is necessary in liquid crystal display devices (LCDs) and is therefore easy to make a thinner device. In addition, a self-luminous OLED has high visibility and no limitation in terms of viewing angle. These are the reasons why light emitting devices using OLEDs are attracting attention as display devices to replace CRTs and LCDs.

An OLED has a layer containing an organic compound (organic light emitting material) that provides luminescence (electroluminescence) when an electric field is applied (the layer is hereinafter referred to as organic light emitting layer), in addition to an anode layer and a cathode layer. Luminescence obtained from organic compounds is classified into light emission upon return to the base state from singlet excitation (fluorescence) and light emission upon return to the base state from triplet excitation (phosphorescence). A light emitting device according to the present invention can use one or both types of light emission.

In this specification, all the layers that are provided between an anode and a cathode of an OLED together make an organic light emitting layer. Specifically, an organic light emitting layer includes a light emitting layer, a hole injection layer, an electron injection layer, a hole transporting layer, an electron transporting layer, etc.

A basic structure of an OLED is a laminate of an anode, a light emitting layer, and a cathode layered in this order. The basic structure can be modified into a laminate of an anode, a hole injection layer, a light emitting layer, and a cathode layered in this order, a laminate of an anode, a hole injection layer, a light emitting layer, an electron transporting layer, and a cathode layered in this order, or the like.

A pixel portion of a light emitting device generally has the structure shown in FIG. 21. A pixel portion 1701 is provided with a plurality of gate signal lines 1705, a plurality of source signal lines 1706, and a plurality of power supply lines 1707.

A region that has one of the gate signal lines 1705, one of the source signal lines 1706, and one of the power supply lines 1707 corresponds to a pixel 1702. The pixel 1702 and similarly structured pixels form a matrix in the pixel portion 1701. Each pixel has an OLED 1703. The OLED 1703 has an anode and a cathode. In this specification, the cathode is called an opposite electrode (second electrode) when the anode is used as a pixel electrode (first electrode) whereas the anode is called the opposite electrode when the cathode serves as the pixel electrode.

The opposite electrode in every OLED 1703 receives a given voltage from a power supply 1704 that is external to the OLED panel. The voltage between the opposite electrode and the pixel electrode is called an OLED drive voltage in this specification.

An enlarged view of the pixel 1702 is shown in FIG. 22. The pixel 1702 has the OLED 1703, a first TFT 1708 that functions as a switching element, a second TFT 1709 that controls a current flowing between the pixel electrode and opposite electrode of the OLED 1703, and a capacitor (storage capacitor) 1710.

A gate electrode of the first TFT 1708 is connected to one of the gate signal lines 1705. The first TFT 1708 has a source region and a drain region one of which is connected to one of the source signal lines 1706 for receiving digital signals and the other of which is connected to a gate electrode of the second TFT 1709.

The second TFT 1709 has a source region and a drain region one of which is connected to one of the power supply lines 1707 and the other of which is connected to a pixel electrode of the OLED 1703. Of two electrodes the capacitor 1710 has, one is electrically connected to one of the power supply lines 1707 and the other is electrically connected to the gate electrode of the second TFT 1709.

Next, a method of driving the light emitting device shown in FIGS. 21 and 22 is described. The description here takes as an example gray scale display using n-bit digital signals.

When an image is displayed using n-bit digital signals, one frame period is divided into at least n sub-frame periods. Each sub-frame period consists of a period for inputting digital signals to pixels (writing period) and a period for display by the pixels in accordance with the bits of the digital signals written.

In a writing period, the voltage of the opposite electrode of every OLED 1703 is kept at the same level as the voltage of the power supply lines 1707 by the power supply 1704. The plural gate signal lines 1705 are selected one by one and the first TFT 1708 is turned ON in order when a gate signal line to which its gate electrode is connected is selected. In this specification, a signal line being selected means turning ON every TFT whose gate electrode is connected to the selected signal line.

When digital signals are inputted to the plural source signal lines 1706 separately, the digital signals are inputted to the gate electrode of the second TFT 1709 through the first TFT 1708 that has been turned ON. The voltage of the digital signals is held in the capacitor 1710.

A digital signal has '0' information or '1' information. A '0' signal is a Lo voltage signal and a '1' signal is a Hi voltage signal, or it may be the other way around.

The gate signal lines 1705 are selected one by one until all of them are selected once and digital signals are inputted to every pixel. Inputting a digital signal to a pixel means inputting a digital signal to the gate electrode of the second TFT 1709. A period required to complete inputting digital signals to all pixels in the pixel portion 1701 is called a writing period.

When completing inputting digital signals to all pixels, a writing period is ended to start a display period. As a display period is started, the power supply 1704 changes the voltage of the opposite electrode in each OLED 1703 to generate a voltage between the opposite electrode and the power supply lines 1707.

If a digital signal inputted to a pixel during a writing period has information of '0', the second TFT 1709 is turned OFF and the OLED 1703 does not emit light. On the other hand, if the digital signal has information of '1', the second TFT 1709 is turned ON to give the voltage of the power supply lines 1707 to the pixel electrode of the OLED 1703. Then, the voltage generated between the opposite electrode and the power supply lines 1707 is applied between the pixel electrode and opposite electrode of the OLED 1703, thereby causing the OLED 1703 to emit light.

During a display period, the voltage of the opposite electrode is set to a level that causes application of forward bias voltage to the OLED 1703 as the voltage of the power supply lines 1707 is given to the pixel electrode.

In this way, whether or not an OLED emits light is determined by information of digital signal and all the pixels are used for display at once.

A desired gray scale is obtained by determining for each of the n sub-frame periods whether or not a pixel emits light in the display period.

In a light emitting device that displays an image using digital signals as the one described above, when the light emitting device is increased in size, the number of pixels is increased and a large amount of current flows throughout the pixel portion. This current flows from a power supply that controls the OLED drive voltage and, therefore, a switch the power supply has for controlling the voltage of the opposite electrode has to have high current capacity.

If a luminance of 200 cd/m$^2$ is to be obtained in a light emitting device, the amount of current required is several mA/cm$^2$. For example, when a 40 inch display device is to be manufactured using a 5 mA/cm$^2$ organic light emitting material, the current required to display is about 25 A, which is considerably a large value.

Generally, a given standard current capacity is set for a switch of a power supply, and this upper limit in current capacity is an obstacle for enlargement of the light emitting device.

Moreover, a driving circuit in the above light emitting device has to be operated at higher frequency and one frame period has to be divided into more sub-frame periods as the number of gray scales is increased. The switch frequency characteristic of power supply, on the other hand, tends to decline as the current capacity is enhanced. As a result, the switch frequency characteristic is lowered and the number of gray scales obtainable is reduced as the light emitting device is increased in size.

SUMMARY OF THE INVENTION

An object of the present invention is to provide measures for solving the above problems accompanying an increase in size of light emitting device. Specifically, an object of the present invention is to lift current value restriction due to a switch of a power supply that controls the OLED drive voltage and to prevent reduction in number of gray scales by preventing lowering of frequency characteristic of a driving circuit due to the switch of the power supply that controls the OLED drive voltage.

In the present invention, one more TFT is provided between a power supply line and a pixel electrode of an OLED. Specifically, a third TFT is provided for controlling the flow of a drain current of a TFT that is switched by a digital signal into an OLED.

Switching of the third TFT is controlled in each line.

The above structure makes it possible to control the OLED drive voltage while giving an opposite electrode of an OLED a constant voltage. Accordingly, a light emitting device of the present invention does not need a switch of a power supply that controls the opposite electrode voltage and, if it has the switch, the current capacity required of the light emitting device is not high.

Switching of the third TFT can be controlled by a voltage applied to a gate electrode of the third TFT and almost no current flows into the gate electrode of the third TFT.

Therefore, enlargement of the light emitting device is not hindered by upper limit in current capacity of the switch of the power supply for the opposite electrode. Moreover, only a small amount of current flows into the switch of the power supply for the opposite electrode and therefore lowering of frequency characteristic of a driving circuit due to the switch can be avoided to prevent reduction in number of gray scales.

The light emitting device of the present invention may employ a transistor formed from single crystal silicon instead of TFTs. If a TFT is employed, the TFT may be formed of polycrystalline silicon or amorphous silicon. The light emitting device may also employ a transistor formed from an organic semiconductor.

BRIEF DESCRIPTION OF THE DRAWINGS

In the accompanying drawings:

FIGS. 11A to 11C are diagrams showing a process of manufacturing a light emitting device according to Embodiment 6;

FIGS. 12A and 12B are diagrams showing a process of manufacturing a light emitting device according to Embodiment 6;

DETAILED DESCRIPTION OF THE PREFERRED EMBODIMENTS

[Embodiment Mode]

Figure 1:
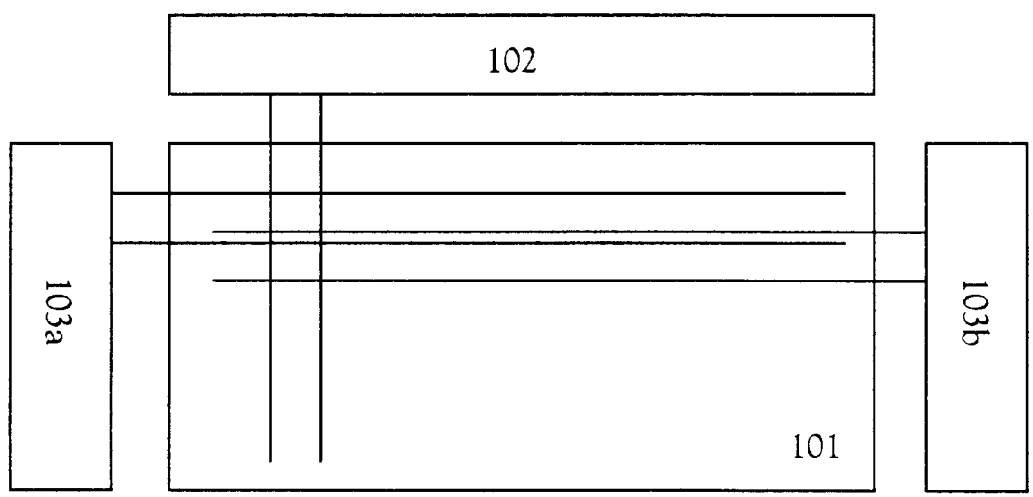
FIG. 1 is a diagram showing the circuit structure of a light emitting device according to the present invention.

FIG. 1 is a block diagram of a light emitting device of the present invention. The light emitting device of FIG. 1 has a pixel portion 101, a source signal side driving circuit 102, a first gate signal side driving circuit 103a, and a second gate signal side driving circuit 103b. The numbers of source signal side driving circuit, first gate signal side driving circuit, and second gate signal side driving circuit can be determined at designer's discretion. The driving circuits, namely, the source signal side driving circuit, the first gate signal side driving circuit, and the second gate signal side driving circuit, may be formed on an OLED panel on which the pixel portion is placed, or may be separately formed to be mounted to the OLED panel.

Figure 2:
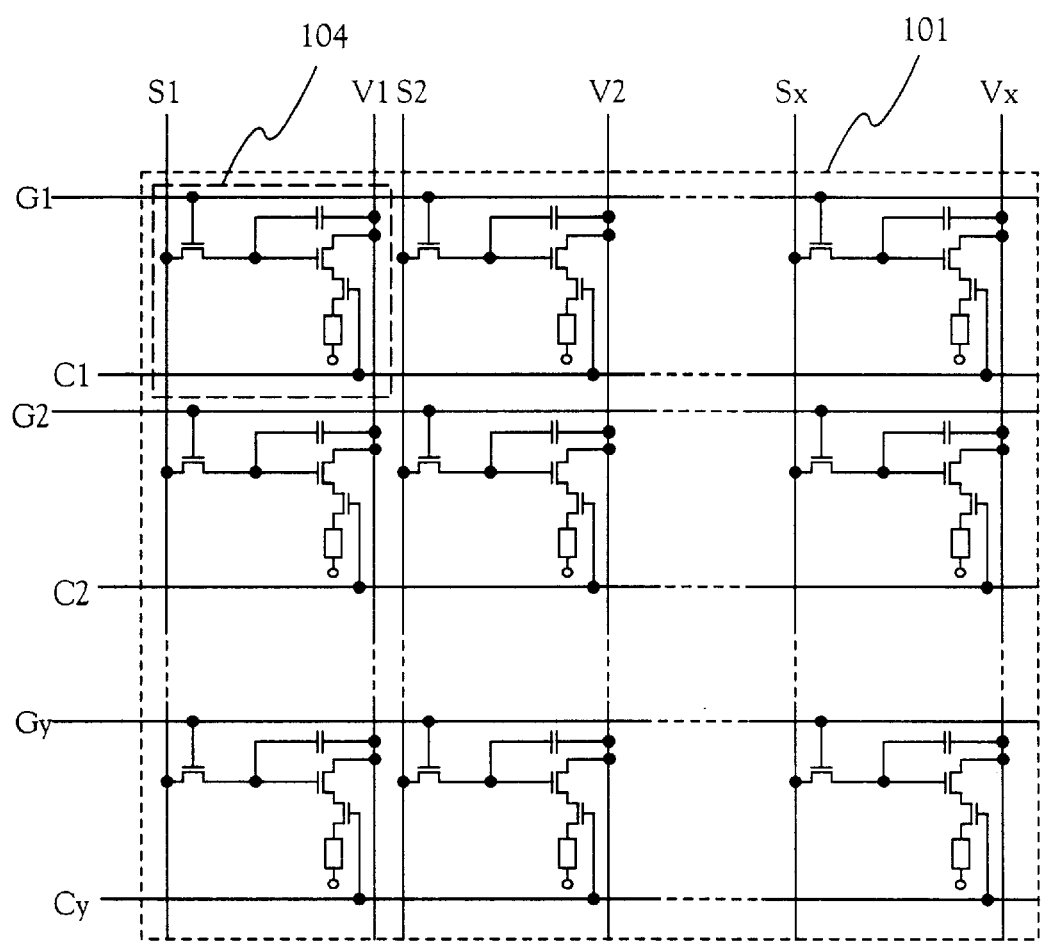
FIG. 2 is a circuit diagram of a pixel portion of a light emitting device according to the present invention.

FIG. 2 shows the structure of the pixel portion 101. The pixel portion 101 is provided with first gate signal lines (G1 to Gy), second gate signal lines (C1 to Cy), source signal lines (S1 to Sx), and power supply lines (V1 to Vx). The number of source signal lines may not always match the number of power supply lines.

The pixel portion 101 has a plurality of pixels arranged so as to form a matrix. Each of the pixels is denoted by 104 and has one of the first gate signal lines, one of the second gate signal lines, one of the source signal lines, and one of the power supply lines.

Figure 3:
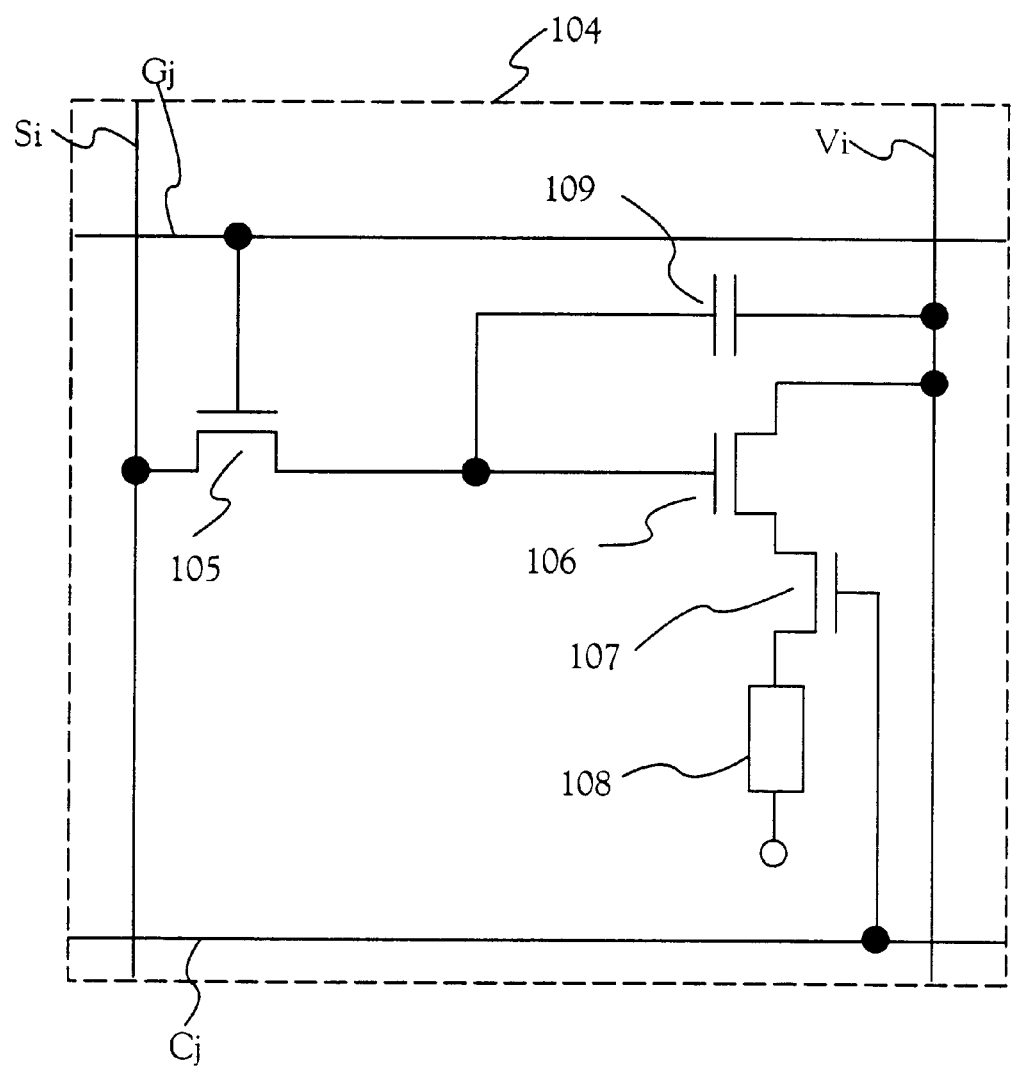
FIG. 3 is a circuit diagram of a pixel of a light emitting device according to the present invention.

Shown in FIG. 3 is an enlarged view of a pixel 104 that has a first gate signal line Gj (j=1 to y), a second gate signal line Cj (j=1 to y), a source signal line Si (i=1 to x), and a power supply line Vi (i=1 to x).

In FIG. 3, the pixel 104 has a first TFT 105, a second TFT 106, a third TFT 107, an OLED 108, and a capacitor 109.

A gate electrode of the first TFT 105 is connected to the first gate signal line Gj. The first TFT 105 has a source region and a drain region one of which is connected to the source signal line Si and the other of which is connected to a gate electrode of the second TFT 106.

The second TFT 106 has a source region and a drain region one of which is connected to the power supply line Vi and the other of which is connected to a source region or a drain region of the third TFT 107.

The third TFT has a gate electrode that is connected to the second gate signal line Cj. Of the source region and the drain region of the third TFT, the one that is not connected to the source region or the drain region of the second TFT 106 is connected to a pixel electrode of the OLED 108.

The capacitor 109 is formed between the gate electrode of the second TFT 106 and the power supply line Vi. The capacitor 109 is not always necessary.

The OLED 108 has an anode, a cathode, and an organic light emitting layer that is placed between the anode and the cathode.

The first TFT 105 may be a p-channel TFT or an n-channel TFT and the same applies to the second TFT 106 and the third TFT 107. However, the second TFT 106 and the third TFT 107 desirably have the same polarity. If the anode is used as the pixel electrode, the third TFT is desirably a p-channel TFT. On the other hand, if the cathode serves as the pixel electrode, the third TFT is desirably an n-channel TFT.

Described next is a method of driving the light emitting device shown in FIGS. 1 though 3 in accordance with the present invention. The description here takes as an example the case of displaying an image in $2^n$ gray scales using n-bit digital signals.

Figure 4:
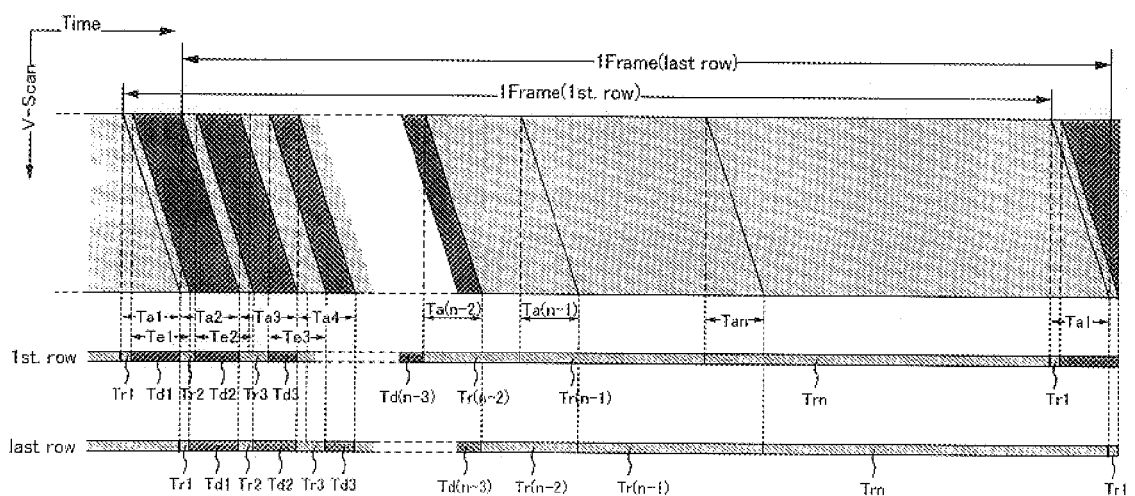
FIG. 4 is a timing chart showing a method of driving a light emitting device according to the present invention.

In FIG. 4, the axis of abscissa indicates the time scale and the axis of ordinate indicates the position of the first gate signal line.

The first gate signal side driving circuit 103a selects the first gate signal line C1 and the first TFT 105 whose gate electrode is connected to the first gate signal line G1 is turned ON in each pixel on Line One. The second gate signal side driving circuit 103b selects the second gate signal line C1 and the third TFT 107 whose gate electrode is connected to the second gate signal line C1 is turned ON in each pixel on Line One.

Then, the first bit digital signal to be inputted to the source signal lines S1 to Sx from the source signal side driving circuit 102 is inputted to the gate electrode of the second TFT 106 through the first TFT 105. In this specification, inputting a digital signal to the gate electrode of the second TFT 106 through the first TFT 105 means inputting a digital signal to a pixel.

A digital signal has '0' information or '1' information. A '0' signal is a Lo voltage signal and a '1' signal is a Hi voltage signal, or it may be the other way around. The second TFT 106 is turned ON or OFF depending on which information of '0' and '1' a digital signal has.

If the second TFT 106 is turned OFF, the voltage of the power supply line Vi is not given to the pixel electrode of the OLED 108 and therefore the OLED 108 does not emit light. If the second TFT 106 is turned ON, the third TFT 107 is turned ON and therefore the voltage of the power supply line Vi is given to the pixel electrode of the OLED 108. As a result, the OLED 108 emits light.

In the light emitting device of the present invention, the voltage between the power supply line and the opposite electrode of the OLED is kept constant. The voltage between the power supply line and the opposite electrode of the OLED is set to a level that causes application of forward bias voltage to the OLED as the voltage of the power supply line is given to the pixel electrode.

In this way, whether or not the OLED 108 emits light is determined upon input of the digital signal to the pixels on Line One. The pixels on Line One are used for display. A period in which pixels are used for display is called a display period Tr. The display period started after the first bit digital signal is inputted to the pixels is a display period Tr1.

When the first gate signal line G1 is no longer selected, the first gate signal line G2 is selected while the second gate signal line C1 is kept selected. As the first gate signal line G2 is selected, the first TFT 105 whose gate electrode is connected to the line G2 is turned ON in each pixel on Line Two and the first bit digital signal is inputted to the pixels on Line Two from the source signal lines S1 to Sx. Then, the second gate signal line C2 is selected to start the display period Tr1 in the pixels on Line Two.

Similarly, the rest of the gate signal lines, namely, the first gate signal lines G3 to Gy and the second gate signal lines C3 to Cy, are selected in order and the display period Tr1 is started in pixels on each of the rest of the lines in order. The point at which the display period is started differs from one line to another. A period required to complete inputting the first bit digital signal to all pixels is a writing period Ta1.

Before inputting the first bit digital signal to all pixels is completed, in other words, before the writing period Ta1 is ended, the second gate signal side driving circuit 103b brings the second gate signal line C1 from being selected to not being selected while the first bit digital signal is inputted to the pixels. This turns OFF the third TFT 107 whose gate electrode is connected to the second gate signal line C1 in each pixel on Line One. Then, the voltage of the power supply line is no longer given to the pixel electrode of the OLED 108, and the OLED 108 in every pixel on Line One stops emitting light and does not perform display.

A period in which pixels are not used for display is called a non display period Td. In the pixels on Line One, the display period Tr1 is ended and a non display period Td1 is started when the second gate signal line C1 is no longer selected.

After stopping selecting the second gate signal line C1, the second gate signal line C2 stops being selected and the third TFT 107 whose gate electrode is connected to the second gate signal line C2 is turned OFF in each pixel on Line Two. Accordingly, the voltage of the power supply line is no longer given to the pixel electrode of the OLED 108, and the OLED 108 in every pixel on Line Two stops emitting light and does not perform display.

The rest of the second gate signal lines, namely, the second gate signal lines C3 to Cy, stop being selected in order in a similar fashion. Similarly to display periods, the point at which the non display period is started differs from one line to another. A period required to stop selecting all the second gate signal lines C1 to Cy is an erasing period Te1.

Before or after the non display period Td1 is started in pixels on all lines, in other words, before or after the erasing period Te1 is ended, the first gate signal line G1 and the second gate signal line C1 are again selected and the second bit digital signal is inputted to the pixels on Line One. As a result, the pixels on Line One are again used for display to end the non display period Td1 and start a display period Tr2.

Similarly, the rest of the gate signal lines, namely, the first gate signal lines G2 to Gy and the second gate signal lines C2 to Cy, are selected in order so that the second bit digital signal is inputted to every pixel. A period required to complete inputting the second bit digital signal to all pixels is a writing period Ta2.

Before inputting the second bit digital signal to all pixels is completed, in other words, before the writing period Ta2 is ended, the second gate signal line C2 stops being selected while the second bit digital signal is inputted to the pixels. Accordingly, the OLED 108 in every pixel on Line One stops emitting light and the pixels on Line one are used for display. Then, the display period Tr2 is ended to start a non-display period Td2 in the pixels on Line One.

All the second gate signal lines C1 to Cy are selected in order and the non-display period Td2 is started in every pixel. A period required to stop selecting the second gate signal line C2 in all pixels is an erasing period Te2.

The above operation is repeated until inputting the m-th bit digital signal to the pixels is completed and a display period Tr and a non display period Td are repeatedly alternated for the duration. The display period Tr1 is started as the writing period Ta1 is started and ends with the start of the erasing period Te1. The non display period Td1 is started as the erasing period Te1 is started and ends with the start of the next writing period (in this case, the writing period Ta2). Similarly to the display period Tr1 and the non-display period Td1, the lengths of the display periods Tr2, Tr3, . . . and Tr(m−1) and the lengths of the non display periods Td2, Td3, . . . and Td(m−1) are determined in relation to the writing periods Ta1, Ta2, . . . and Tam and the erasing periods Te1, Te2, . . . and Te(m−1).

To simplify the explanation, FIG. 4 takes as an example the case where m=n−2. However, the present invention is not limited thereto. In the present invention, m can be any number from 1 through n.

When the m [n−2]-th bit digital signal is inputted to the pixels on Line One (a number in [ ] is of when m=n−2), a display period Trm [n−2] is started in the pixels on Line One and the pixels on Line One are used for display. The m [n−2]-th bit digital signal is held in the pixels until the digital signal of the next bit is inputted. At this point, the second gate signal line is kept selected.

When the next digital signal, the (m+1) [n−1]-th bit digital signal, is inputted to the pixels on Line One, the m [n−2]-th bit digital signal that has been held in the pixels is replaced by the (m+1) [n−1]-th bit digital signal through rewriting. At this point, the second gate signal line is kept selected. Then, a display period Tr(m+1) [n−1] is started in the pixels on Line One and the pixels on Line One are used for display. The (m+1) [n−1]-th bit digital signal is held in the pixels until the digital signal of the next bit is inputted.

The above operation is repeated until inputting the n-th bit digital signal to pixels is completed. The display period Trm [n−2] is started as the writing period Tam [n−2] is started and ends with the start of the next writing period. The display period Trn is started as the writing period Tan is started and ends with the start of the next writing period. The lengths of the display periods that come between Trm and Trn are determined in a similar manner.

When all the display periods Tr1 to Trn are finished, one image can be displayed. In the present invention, a period required to ready one image for display is called one frame period (F).

After one frame period is ended, the first gate signal line G1 and the second gate signal line C1 are again selected. Then, the first bit digital signal is inputted to pixels on Line One to again start the display period Tr1 in the pixels on Line One. The operation described above is thus repeated once more.

The light emitting device desirably has 60 or more frame periods in one second. If the number of images displayed in one second is less than 60, flickering of image may be recognizable.

In the present invention, it is important that the sum of lengths of all the writing periods is shorter than the length of one frame period. It is also important that the lengths of the display periods are set to satisfy Tr1:Tr2:Tr3: . . . :Tr(n−1):Trn=$2^0:2^1:2^2: \ldots :2^{(n-2)}:2^{(n-1)}$. A desired gray scale out of $2^n$ gray scales can be obtained by combining the display periods.

The gray scale of a pixel in one frame period is determined by the sum of lengths of display periods in the one frame period in which the OLED of that pixel emits light. For example, if n=8, a pixel obtains 100% of luminance when the pixel emits light in all display periods. When the pixel emits light in Tr1 and Tr2, the luminance of the pixel is 1%. When the pixel emits light in Tr3, Tr5, and Tr8, the luminance of the pixel is 60%.

It is important that the length of the writing period Tam for writing the m-th bit digital signal to the pixels is shorter than the length of the display period Trm. Therefore, the bit number m has to take a value between 1 and n which makes the writing period Tam shorter than the display period Trm.

The display periods Tr1 to Trn may be run in any order. For instance, in one frame period started by Tr1, the display periods Tr3, Tr5, Tr2, ... may follow the display period Tr1 in this order. However, it is preferred if the order chosen does not make the display periods Tr1 to Trn overlap one another. Also, it is preferred if the order chosen does not make the erasing periods Te1 to Ten overlap one another.

With the above structures, the present invention stops the upper limit in current capacity of a switch of a power supply for an opposite electrode from being an obstacle to enlargement of a light emitting device. Moreover, only a small amount of current flows into the switch of the power supply for the opposite electrode and therefore lowering of frequency characteristic of a driving circuit due to the switch can be avoided to prevent reduction in number of gray scales.

In the present invention, a display period partially overlaps a writing period. In other words, an image can be displayed by pixels during a writing period. Therefore, the ratio (duty ratio) of the sum of the lengths of the display periods in one frame period is not determined by the lengths of the writing periods alone.

Although a capacitor is provided in order to hold the voltage applied to the gate electrode of the second TFT in this embodiment mode, the capacitor may be omitted. If the second TFT has an LDD region that overlaps the gate electrode with a gate insulating film interposed therebetween, a parasitic capacitance generally called a gate capacitance is formed in this overlap region. The gate capacitance may be actively utilized as a capacitor for holding the voltage applied to the gate electrode of the second TFT.

A plurality of TFTs electrically connected in series at their gate electrodes can act as one TFT and may be used for the first TFT, the second TFT, or the third TFT. If the first TFT has this structure, the OFF current of the first TFT can be reduced. If the second TFT and the third TFT have this structure, the second TFT and the third TFT are degraded less by heat.

The capacitance of the gate capacitance varies depending on the area of the region where the gate electrode and the LDD region overlap each other, and therefore is determined by the length of the LDD region in the overlap region.

Embodiments of the present invention will be shown below.

[Embodiment 1]

This embodiment describes a top view of the pixel shown in FIG. 3.

Figure 5:
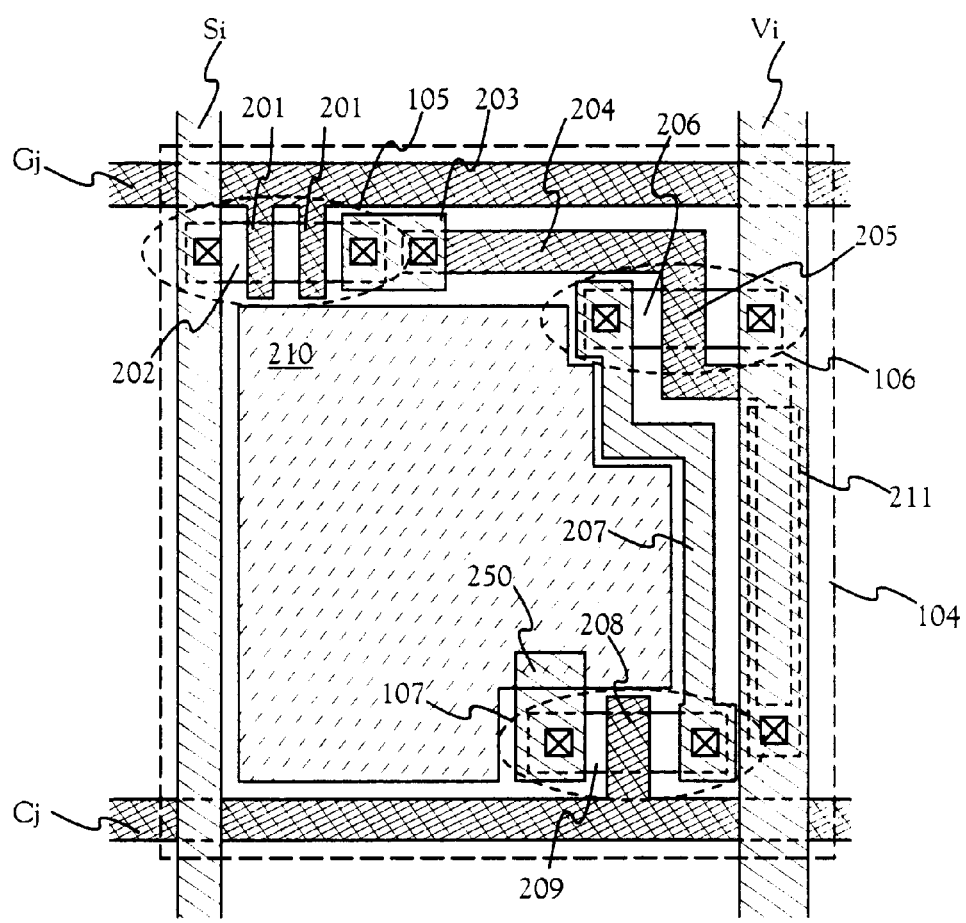
FIG. 5 is a top view of a pixel of a light emitting device according to Embodiment 1.

FIG. 5 is a top view of a pixel of this embodiment. A region having a source signal line Si, a power supply line Vi, a first gate signal line Gj, and a second gate signal line Cj corresponds to a pixel 104.

A first TFT 105 has a gate electrode 201 that is electrically connected to the first gate signal line Gj. A semiconductor film 202 of the first TFT 105 includes a source region and a drain region one of which is connected to the source signal line Si and the other of which is connected to a gate wiring line 204 through a wiring line 203.

A part of the gate wiring line 204 functions as a gate electrode 205 of a second TFT 106. A semiconductor film 206 of the second TFT 106 includes a source region and a drain region one of which is connected to the power supply line Vi and the other of which is connected to a wiring line 207.

A third TFT 107 has a gate electrode 208 that is electrically connected to the second gate signal line Cj. A semiconductor film 209 of the third TFT 107 includes a source region and a drain region one of which is connected to the wiring line 207 and the other of which is connected to a pixel electrode 210 through a wiring line 250.

Denoted by 211 is a semiconductor film for a capacitance which is formed at the same time the semiconductor films 202, 206, and 209 are formed. The semiconductor film 211 overlaps the gate wiring line 204 with an insulating film (not shown) interposed therebetween to form a capacitor. The gate wiring line 204 overlaps the power supply line Vi with an insulating film (not shown) interposed therebetween.

The structure of the pixel shown in FIG. 3 is not limited to the structure of FIG. 5.

[Embodiment 2]

This embodiment describes an arrangement of pixels in a light emitting device of the present invention.

Circuit diagrams of pixels of this embodiment are shown in FIGS. 6A and 6B and FIGS. 7A and 7B.

Figure 6A:
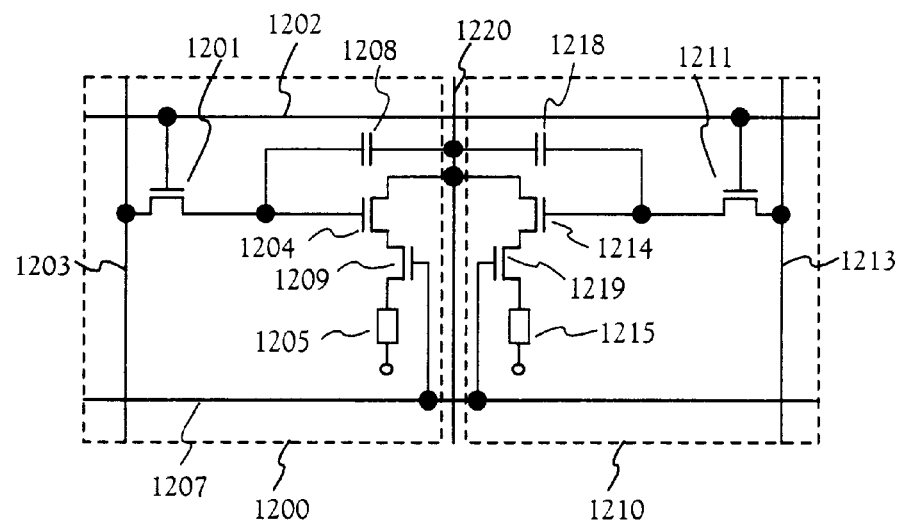
FIGS. 6A and 6B are circuit diagrams of pixels of a light emitting device according to Embodiment 2.

In FIG. 6A, a pixel 1200 and a pixel 1210 are adjacent to each other. The pixel 1200 has a first TFT 1201, a second TFT 1204, a third TFT 1209, an OLED 1205, and a capacitor 1208. The pixel 1210 has a first TFT 1211, a second TFT 1214, a third TFT 1219, an OLED 1215, and a capacitor 1218.

The pixel 1200 has a source signal line 1203 and the pixel 1210 has a source signal line 1213. The pixel 1200 and the pixel 1210 share a first gate signal line 1202, a second gate signal line 1207, and a power supply line 1220.

By sharing one power supply line between adjacent pixels, the number of power supply lines can be reduced compared to the structure shown in FIG. 3. When wiring lines are reduced in number, the yield can be raised. Less wiring lines also means a smaller area ratio of wiring lines to the pixel portion. Therefore, when the wiring lines are placed in the path of light emitted from the organic light emitting layer, less amount of light is blocked by the wiring lines.

Figure 6B:
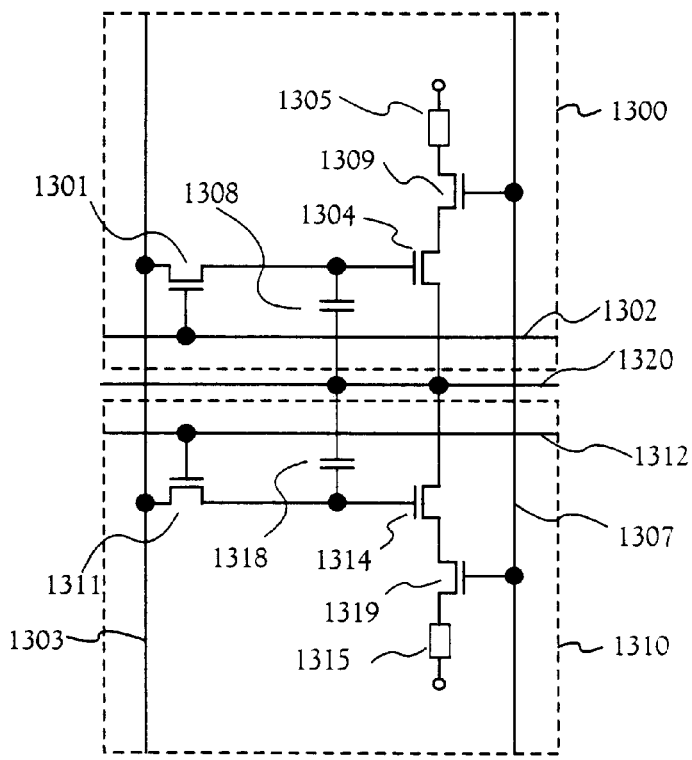

FIG. 6B shows another example of arrangement of pixels of the present invention. In FIG. 6B, a pixel 1300 and a pixel 1310 are adjacent to each other.

The pixel 1300 has a first TFT 1301, a second TFT 1304, a third TFT 1309, an OLED 1305, and a capacitor 1308. The pixel 1310 has a first TFT 1311, a second TFT 1314, a third TFT 1319, an OLED 1315, and a capacitor 1318.

The pixel 1300 has a first gate signal line 1302 and the pixel 1310 has a first gate signal line 1312. The pixel 1300 and the pixel 1310 share a source signal line 1303, a second gate signal line 1307, and a power supply line 1320.

By sharing one first gate signal line between adjacent pixels, the number of first gate signal lines can be reduced compared to the structure shown in FIG. 3. When wiring lines are reduced in number, the yield can be raised. Less wiring lines also means a smaller area ratio of wiring lines to the pixel portion. Therefore, when the wiring lines are placed in the path of light emitted from the organic light emitting layer, less amount of light is blocked by the wiring lines.

Figure 7A:
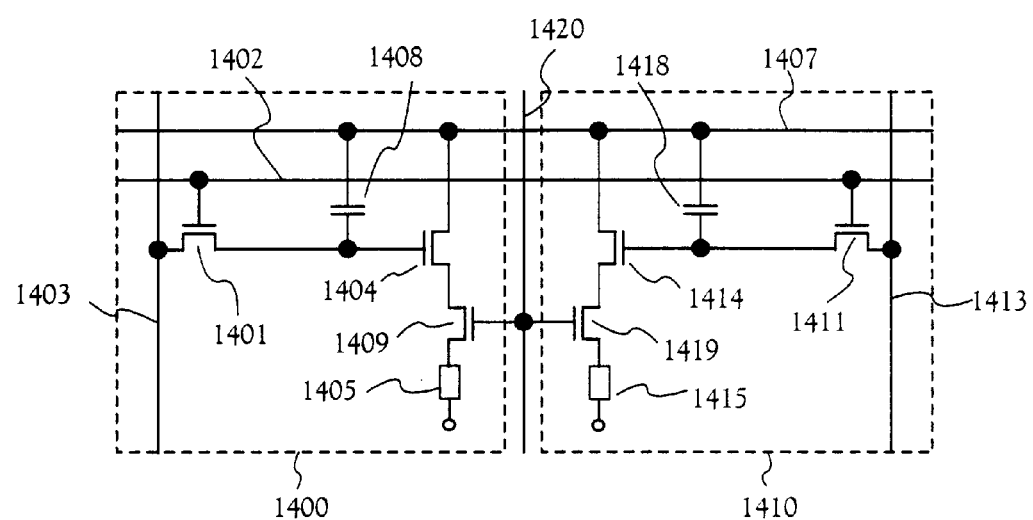
FIGS. 7A and 7B are circuit diagrams of pixels of a light emitting device according to Embodiment 2.

FIG. 7A shows another example of arrangement of pixels of the present invention. In FIG. 7A, a pixel 1400 and a pixel 1410 are adjacent to each other.

The pixel 1400 has a first TFT 1401, a second TFT 1404, a third TFT 1409, an OLED 1405, and a capacitor 1408. The pixel 1410 has a first TFT 1411, a second TFT 1414, a third TFT 1419, an OLED 1415, and a capacitor 1418.

The pixel 1400 has a source signal line 1403 and the pixel 1410 has a source signal line 1413. The pixel 1400 and the pixel 1410 share a first gate signal line 1402, a second gate signal line 1407, and a power supply line 1420.

By sharing one second gate signal line between adjacent pixels, the number of second gate signal lines can be reduced compared to the structure shown in FIG. 3. When wiring lines are reduced in number, the yield can be raised. Less wiring lines also means a smaller area ratio of wiring lines to the pixel portion. Therefore, when the wiring lines are placed in the path of light emitted from the organic light emitting layer, less amount of light is blocked by the wiring lines.

Figure 7B:
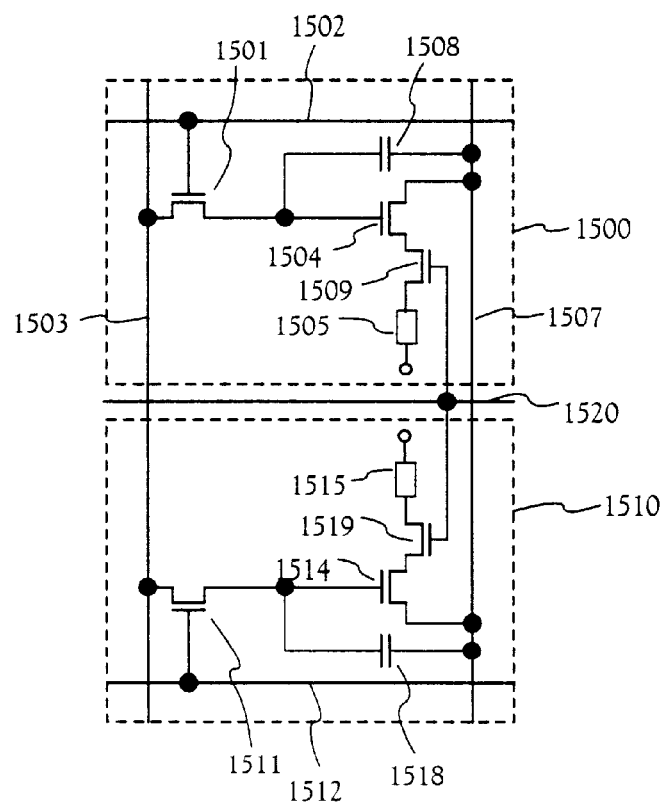

FIG. 7B shows another example of arrangement of pixels of the present invention. In FIG. 7B, a pixel 1500 and a pixel 1510 are adjacent to each other.

The pixel 1500 has a first TFT 1501, a second TFT 1504, a third TFT 1509, an OLED 1505, and a capacitor 1508. The pixel 1510 has a first TFT 1511, a second TFT 1514, a third TFT 1519, an OLED 1515, and a capacitor 1518.

The pixel 1500 has a first gate signal line 1502 and the pixel 1510 has a first gate signal line 1512. The pixel 1500 and the pixel 1510 share a source signal line 1503, a second gate signal line 1520, and a power supply line 1507.

By sharing one second gate signal line between adjacent pixels, the number of second gate signal lines can be reduced compared to the structure shown in FIG. 3. When wiring lines are reduced in number, the yield can be raised. Less wiring lines also means a smaller area ratio of wiring lines to the pixel portion. Therefore, when the wiring lines are placed in the path of light emitted from the organic light emitting layer, less amount of light is blocked by the wiring lines.

Note that the structure of this embodiment can be combined freely with the structure of Embodiment 1.

[Embodiment 3]

This embodiment describes a composition of pixels in a light emitting device of the present invention that is different from that of FIG. 3.

Figure 8:
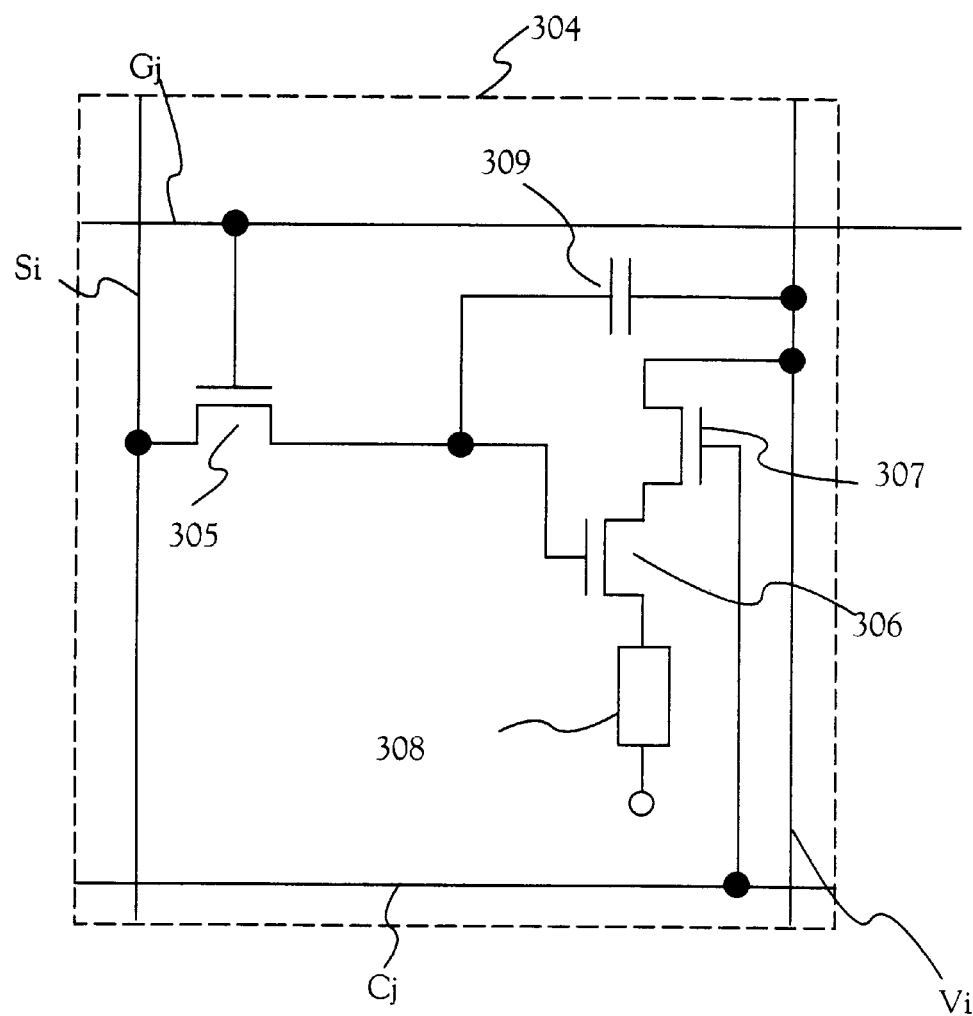
FIG. 8 is a circuit diagram of a pixel of a light emitting device according to Embodiment 3.

In FIG. 8, a pixel 304 has a first TFT 305, a second TFT 306, a third TFT 307, an OLED 308, and a capacitor 309.

A gate electrode of the first TFT 305 is connected to a first gate signal line Gj. The first TFT 305 has a source region and a drain region one of which is connected to a source signal line Si and the other of which is connected to a gate electrode of the second TFT 306.

The second TFT 306 has a source region and a drain region one of which is connected to a pixel electrode of the OLED 308 and the other of which is connected to a source region or a drain region of the third TFT 307.

The third TFT 307 has a gate electrode that is connected to a second gate signal line Cj. Of the source region and the drain region of the third TFT 307, the one that is not connected to the source region or the drain region of the second TFT 306 is connected to a power supply line Vi.

The capacitor 309 is formed between the gate electrode of the second TFT 306 and the power supply line Vi. The capacitor 309 is not always necessary.

The OLED 308 has an anode, a cathode, and an organic light emitting layer that is placed between the anode and the cathode.

The first TFT 305 may be a p-channel TFT or an n-channel TFT and the same applies to the second TFT 306 and the third TFT 307. However, the second TFT 306 and the third TFT 307 desirably have the same polarity. If the anode is used as the pixel electrode, the third TFT is desirably a p-channel TFT. On the other hand, if the cathode serves as the pixel electrode, the third TFT is desirably an n-channel TFT.

Note that the structure of this embodiment can be combined freely with the structure of Embodiment 1 or 2.

[Embodiment 4]

In this embodiment, a detailed structure of a source signal line driving circuit, a first gate signal line driving circuit, which are used for driving a pixel portion of a light emitting device of the present invention are explained. The structure of the first gate signal line driving circuit is only typically explained here, because the second gate signal line driver circuit can be use the same structure of the first gate signal line driver circuit.

Figure 9A:
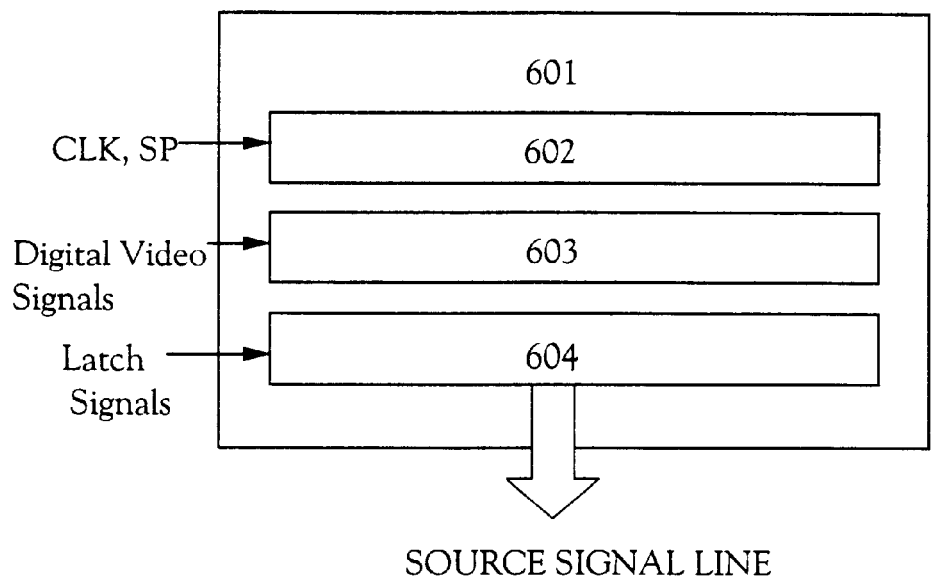
FIGS. 9A and 9B are block diagrams showing the structures of driving circuits of a light emitting device according to Embodiment 4.
Figure 9B:
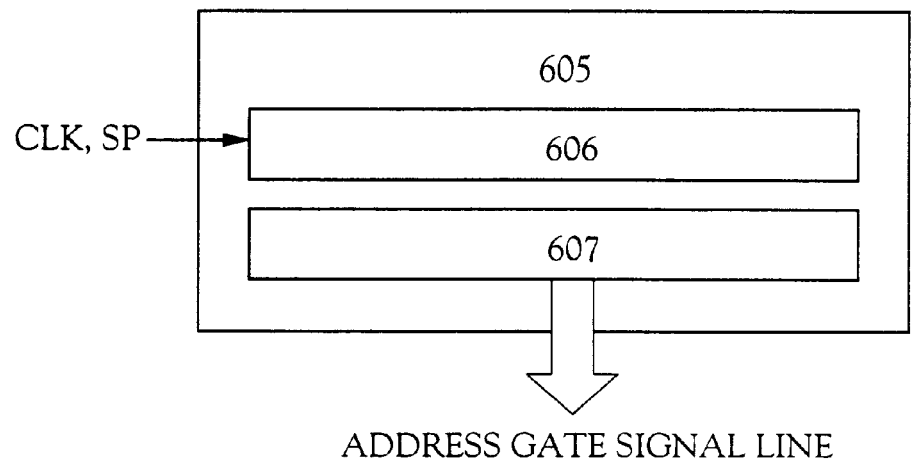

The block figure of a light emitting device of this embodiment is shown in FIGS. 9A and 9B. FIG. 9A shows the source signal line driving 601, which has a shift register 602, a latch (A) 603, and a latch (B) 604.

A clock signal CLK and a start pulse SP are input to the shift register 602 in the source signal line driving circuit 601. The shift register 602 generates timing signals in order based upon the clock signal CLK and the start pulse SP, and supplies the timing signals one after another to the subsequent stage circuit through the buffer (not illustrated) and the like.

Note that, the timing signals output from the shift register circuit 602 may be buffer amplified by a buffer and the like. The load capacitance (parasitic capacitance) of a wiring to which the timing signals are supplied is large because many of the circuits or elements are connected to the wiring. The buffer is formed in order to prevent bluntness in the rise and fall of the timing signal, generated due to the large load capacitance. In addition, the buffer is not always necessary provided.

The timing signal amplified by a buffer is inputted to the latch (A) 603. The latch (A) 603 has a plurality of latch stages for processing n-bit digital video signals. The latch (A) 603 writes in and maintains the n-bit digital video signal input from external of the source signal line driving circuit 601, when the timing signal is input.

Note that the digital video signal may also be input in order to the plurality of latch stages of the latch (A) 603 in writing in the digital video signal to the latch (A) 603. However, the present invention is not limited to this structure. The plurality of latch stages of the latch (A) 603 may be divided into a certain number of groups, and the digital video signal may be input to the respective groups at the same time in parallel, performing partitioned driving. For example, when the latches are divided into groups every four stages, it is referred to as partitioned driving with 4 divisions.

The period during which the digital video signal is completely written into all of the latch stages of the latch (A) 603 is referred to as a line period. In practice, there are cases in which the line period includes the addition of a horizontal return period to the above line period.

One line period is completed, the latch signal is inputted to the latch (B) 604. At the moment, the digital video signal written into and stored in the latch (A) 603 is send all together to be written into and stored in all stages of the latch (B) 604.

In the latch (A) 603 after completing sending the digital video signal to the latch (B) 604, it is performed to write into the digital video signal in accordance with the timing signal from the shift resister 602.

In the second ordered one line period, the digital video signal that is written into and stored in the latch (B) 604 is inputted to the source signal line.

FIG. 9B is a block figure showing the structure of the first gate signal line driving circuit.

The first gate signal line driving circuit 605 has the shift resister 606 and the buffer 607. According to circumstances, the level shift is provided.

In the first gate signal line driving circuit 605, the timing signal from the shift resister 606 is inputted to the buffer 607, and then to a corresponding address gate signal line. The gate electrodes of the address TFTs for one line of pixels are connected to the address gate signal lines, and all of the address TFTs of the one line of pixels must be placed in an ON state simultaneously. A circuit that is capable of handling the flow of a large electric current is therefore used for the buffer.

This embodiment can be implemented by combining freely with Embodiments 1 to 3.

[Embodiment 5]

In the light emitting device of the present invention, the material using an organic light emitting layer included in OLED is not limited to an organic light emitting material, an inorganic light emitting material can also be used. Because the current inorganic light emitting material has extremely high driving voltage, the TFT, which has as high pressure tightness as it can resist the voltage of inorganic light emitting material, must be used.

If the inorganic light emitting material with lower driving voltage is developed, the inorganic light emitting materials will possible to be applied to the present invention.

The structure of this embodiment can be combined freely with any of Embodiments 1 to 4.

[Embodiment 6]

In this embodiment, a method of simultaneously manufacturing TFTs of driving circuit portions provided in the pixel portion and the periphery thereof (a source signal line driving circuit, a first gate signal line driving circuit and a second gate signal driving circuit) is described. However, in order to simplify the explanation, a CMOS circuit, which is the basic circuit for the driving circuit, is shown in the figures. In this embodiment, the first and the second TFTs of the pixel portion are only illustrated, however, the third TFT can be manufactured simultaneously with the first and the second TFTs.

Figure 10A:
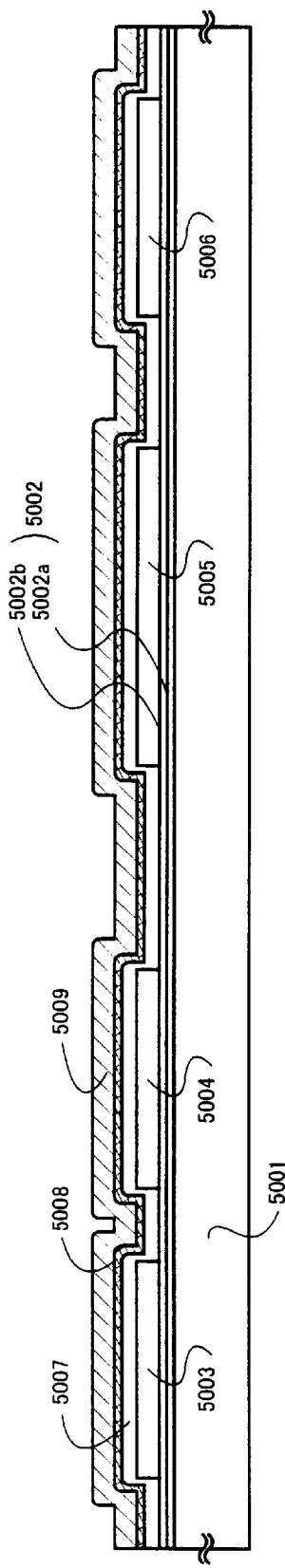
FIGS. 10A to 10C are diagrams showing a process of manufacturing a light emitting device according to Embodiment 6.

First, as shown in FIG. 10A, a base film 5002 made of an insulating film such as a silicon oxide film, a silicon nitride film, or a silicon nitride oxide film is formed on a substrate 5001 made of glass such as barium borosilicate glass or alumino borosilicate glass, typified by #7059 glass or #1737 glass of Corning Inc. For example, a silicon nitride oxide film 5002a fabricated from $SiH_4$, $NH_3$ and $N_2O$ by a plasma CVD method is formed with a thickness of 10 to 200 nm (preferably 50 to 100 nm), and a hydrogenated silicon nitride oxide film 5002b similarly fabricated from $SiH_4$ and $N_2O$ is formed with a thickness of 50 to 200 nm (preferably 100 to 150 nm) to form a lamination. In Embodiment 6, although the base film 5002 is shown as the two-layer structure, the film may be formed of a single layer film of the foregoing insulating film or as a lamination structure of more than two layers.

Semiconductor layers 5003 to 5006 are formed of a crystalline semiconductor film manufactured by using a laser crystallization method on a semiconductor film having an amorphous structure, or by using a known thermal crystallization method. The thickness of the semiconductor films 5003 to 5006 is set from 25 to 80 nm (preferably between 30 and 60 nm). There is no limitation on the crystalline semiconductor film material, but it is preferable to form the film from silicon or a silicon germanium (SiGe) alloy.

A laser such as a pulse oscillation type or continuous emission type excimer laser, a YAG laser, or a $YVO_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 300 Hz, and the laser energy density is set from 100 to 400 $mJ/cm^2$ (typically between 200 and 300 $mJ/cm^2$) when using the excimer laser. Further, the second harmonic is utilized when using the YAG laser, the pulse oscillation frequency is set from 30 to 300 kHz, and the laser energy density may be set from 300 to 600 $mJ/cm^2$ (typically between 350 and 500 $mJ/cm^2$). The laser light, which has been condensed into a linear shape with a width of 100 to 1000 $\mu m$, for example 400 $\mu m$, is then irradiated over the entire surface of the substrate. This is performed with an overlap ratio of 50 to 90%.

Next, a gate insulating film 5007 is formed covering the semiconductor layers 5003 to 5006. The gate insulating film 5007 is formed of an insulating film containing silicon with a thickness of 40 to 150 nm by a plasma CVD method or a sputtering method. A 120 nm thick silicon nitride oxide film is formed in Embodiment 6. The gate insulating film is not limited to such a silicon nitride oxide film, of course, and other insulating films containing silicon may also be used, in a single layer or in a lamination structure. For example, when using a silicon oxide film, it can be formed by the plasma CVD method with a mixture of TEOS (tetraethyl orthosilicate) and $O_2$, at a reaction pressure of 40 Pa, with the substrate temperature set from 300 to 400° C., and by discharging at a high frequency (13.56 MHz) with electric power density of 0.5 to 0.8 $W/cm^2$. Good characteristics of the silicon oxide film thus manufactured as a gate insulating film can be obtained by subsequently performing thermal annealing at 400 to 500° C.

A first conductive film 5008 and a second conductive film 5009 are then formed on the gate insulating film 5007 in order to form gate electrodes. In Embodiment 6, the first conductive film 5008 is formed from Ta with a thickness of 50 to 100 nm, and the second conductive film 5009 is formed from W with a thickness of 100 to 300 nm.

The Ta film is formed by sputtering, and sputtering of a Ta target is performed by using Ar. If an appropriate amount of Xe or Kr is added to the Ar during sputtering, the internal stress of the Ta film will be relaxed, and film peeling can be prevented. The resistivity of an a phase Ta film is on the order of 20 $\mu\Omega cm$, and the Ta film can be used for the gate electrode, but the resistivity of b phase Ta film is on the order of 180 $\mu\Omega cm$ and the Ta film is unsuitable for the gate electrode. The a phase Ta film can easily be obtained if a tantalum nitride film, which possesses a crystal structure near that of a phase Ta, is formed with a thickness of 10 to 50 nm as a base for Ta in order to form the a phase Ta film.

The W film is formed by sputtering with W as a target. The W film can also be formed by a thermal CVD method using tungsten hexafluoride ($WF_6$). Whichever is used, it is necessary to make the film low resistant in order to use it as the gate electrode, and it is preferable that the resistivity of the W film be set 20 $\mu\Omega$cm or less. The resistivity can be lowered by enlarging the crystals of the W film, but for cases where there are many impurity elements such as oxygen within the W film, crystallization is inhibited, and the film becomes high resistant. A W target having a purity of 99.9999% or 99.99% is thus used in sputtering. In addition, by forming the W film while taking sufficient care such that no impurities from the inside of the gas phase are introduced at the time of film formation, a resistivity of 9 to 20 $\mu$cm can be achieved.

Note that although the first conductive film 5008 and the second conductive film 5009 are formed from Ta and W, respectively, in Embodiment 6, the conductive films are not limited to these. Both the first conductive film 5008 and the second conductive film 5009 may also be formed from an element selected from the group consisting of Ta, W, Ti, Mo, Al, and Cu, or from an alloy material or a chemical compound material having one of these elements as its main constituent. Further, a semiconductor film, typically a polysilicon film, into which an impurity element such as phosphorous is doped, may also be used. Examples of preferable combinations other than that in Embodiment 6 include: the first conductive film 5008 formed from tantalum nitride (TaN) and the second conductive film 5009 formed from W; the first conductive film 5008 formed from tantalum nitride (TaN) and the second conductive film 5009 formed from Al; and the first conductive film 5008 formed from tantalum nitride (TaN) and the second conductive film 5009 formed from Cu. (FIG. 10A)

Next, a mask 5010 is formed from resist, and a first etching process is performed in order to form electrodes and wirings. An ICP (inductively coupled plasma) etching method is used in Embodiment 6. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. The W film and the Ta film are both etched on the same order when $CF_4$ and $Cl_2$ are mixed.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. First shape conductive layers 5011 to 5016 (first conductive layers 5011a to 5016a and second conductive layers 5011b to 5016b) are thus formed of the first conductive layer and the second conductive layer by the first etching process. At this point, regions of the gate insulating film 5007 not covered by the first shape conductive layers 5011 to 5016 are made thinner by approximately 20 to 50 nm by etching.

Figure 10B:
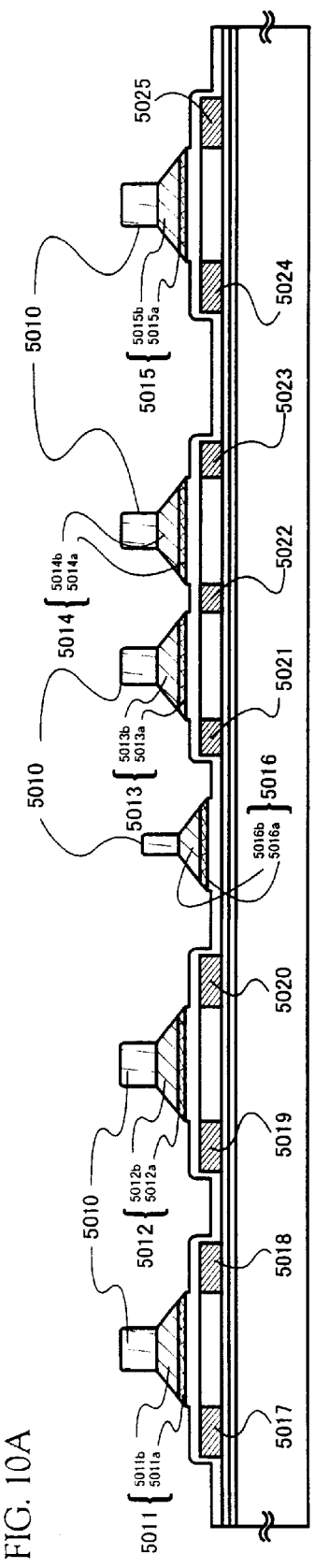

Then, a first doping process is performed to add an impurity element for imparting a n-type conductivity. Doping may be carried out by an ion doping method or an ion injecting method. The condition of the ion doping method is that a dosage is $1\times10^{13}$ to $5\times10^{14}$ atoms/$cm^2$, and an acceleration voltage is 60 to 100 keV. As the impurity element for imparting the n-type conductivity, an element belonging to group 15, typically, phosphorus (P) or arsenic (As) is used, but phosphorus is used here. In this case, the conductive layers 5011 to 5015 become masks to the impurity element to impart the n-type conductivity, and first impurity regions 5017 to 5025 are formed in a self-aligning manner. The impurity element to impart the n-type conductivity in the concentration range of $1\times10^{20}$ to $1\times10^{21}$ atoms/$cm^3$ is added to the first impurity regions 5017 to 5025. (FIG. 10B)

Figure 10C:
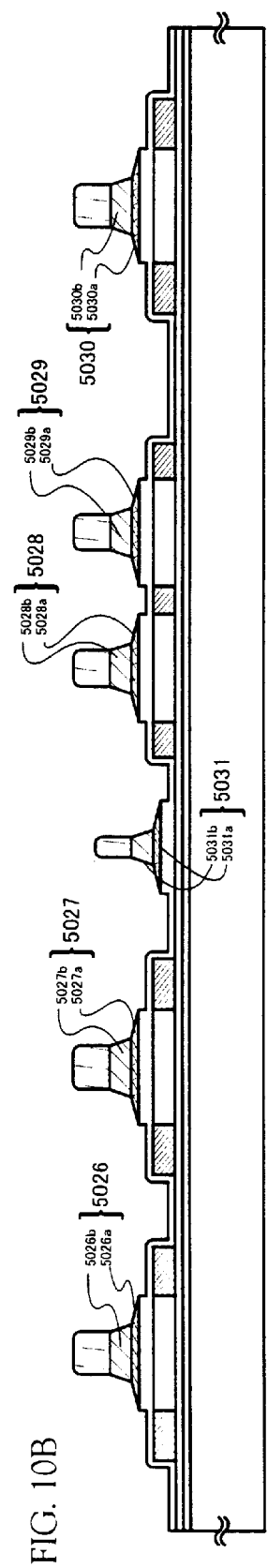

Next, as shown in FIG. 10C, a second etching process is performed without removing the resist mask. The etching gas of the mixture of $CF_4$, $Cl_2$ and $O_2$ is used, and the W film is selectively etched. At this point, second shape conductive layers 5026 to 5031 (first conductive layers 5026a to 5031a and second conductive layers 5026b to 5031b) are formed by the second etching process. Regions of the gate insulating film 5007, which are not covered with the second shape conductive layers 5021 to 5026 are made thinner by about 20 to 50 nm by etching.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 11A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1\times10^{13}$ atoms/$cm^2$, so that new impurity regions are formed inside of the first impurity regions formed into semiconductor layers in FIG. 10B. Doping is carried out such that the second shape conductive layers 5026 to 5030 are used as masks to the impurity element and the impurity element is added also to the regions under the first conductive layers 5026a to 5030a. In this way, third impurity regions 5032 to 5036 are formed. The concentration of phosphorous (P) added to the third impurity regions 5032 to 5036 has a gentle concentration gradient in accordance with the thickness of tapered portions of the first conductive layers 5026a to 5030a. Note that in the semiconductor layer that overlap with the tapered portions of the first conductive layers 5026a to 5030a, the concentration of impurity element slightly falls from the end portions of the tapered portions of the first conductive layers 5026a to 5030a toward the inner portions, but the concentration keeps almost the same level.

As shown in FIG. 11B, a third etching process is performed. This is performed by using a reactive ion etching method (RIE method) with an etching gas of $CHF_3$. The tapered portions of the first conductive layers 5026a to 5031a are partially etched, and the region in which the first conductive layers overlap with the semiconductor layer is reduced by the third etching process. Third shape conductive layers 5037 to 5042 (first conductive layers 5037a to 5042a and second conductive layers 5037b to 5042b) are formed. At this point, regions of the gate insulating film 5007, which are not covered with the third shape conductive layers 5037 to 5042 are made thinner by about 20 to 50 nm by etching.

By the third etching process, in the case of third impurity regions 5032 to 5036, third impurity regions 5032a to 5036a which overlap with the first conductive layers 5037a to 5041a, and second impurity regions 5032b to 5236b between the first impurity regions and the third impurity regions.

Then, as shown in FIG. 11C, fourth impurity regions 5043 to 5054 having a conductivity type opposite to the first conductivity type are formed in the semiconductor layers 5004 and 5006 forming p-channel TFTs. The third conductive layers 5038b and 5041b are used as masks to an impurity element, and the impurity regions are formed in a self-aligning manner. At this time, the whole surfaces of semiconductor layers 5003 and 5005 forming an n-channel type TFT, and the wiring portion 5042 are covered with a resist mask 5200. Phosphorus is added to the impurity regions 5043 to 5054 at different concentrations, respectively. The regions are formed by an ion doping method using diborane ($B_2H_6$) and the impurity concentration is made $2 \times 10^{20}$ to $2 \times 10^{21}$ atoms/cm$^3$ in any of the regions.

By the steps up to this, the impurity regions are formed in the respective semiconductor layers. The third shape conductive layers 5037 to 5041 overlapping with the semiconductor layers function as gate electrodes. The numeral 5042 functions as an island-like source signal line.

After the resist mask 5200 is removed, a step of activating the impurity elements added in the respective semiconductor layers for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 6, a heat treatment is conducted at 500° C. for 4 hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating semiconductor layers is conducted. This step is a step of terminating dangling bonds in the semiconductor layer by thermally excited hydrogen. As another means for hydrogenation, plasma hydrogenation (using hydrogen excited by plasma) may be carried out.

As shown in FIG. 12A, a first interlayer insulating film 5055 is formed next from a silicon oxynitride film with a thickness of 100 to 200 nm. A second interlayer insulating film 5056 is formed thereon from an organic insulating material. Thereafter, contact holes are formed through the first interlayer insulating film 5055, the second interlayer insulating film 5056, and the gate insulating film 5007. Respective wirings (including connecting wirings and signal lines) 5057 to 5062 and 5064 are formed by patterning. After that, the pixel electrode 5063 contacting with the connecting wiring 5062 is formed by patterning.

The second interlayer insulating film 5056 is a film made of an organic resin. Examples of the usable organic resin include polyimide, polyamide, acrylic resin, and BCB (benzocyclobutene). Since planarization is a significant aspect of the role of the second interlayer insulating film 5056, acrylic resin that can level the surface well is particularly preferable. In this embodiment, the acrylic film is thick enough to eliminate the level differences caused by the TFTs. An appropriate thickness of the film is 1 to 5 μm (preferably 2 to 4 μm).

The contact holes are formed by dry etching or wet etching, and include contact holes reaching the impurity regions 5017, 5018, 5021 and 5023 having the n-type conductivity or the impurity regions 5043 and 5054 having the p-type conductivity, contact holes reaching wiring lines 5042, contact holes (not shown) reaching the power supply lines, and contact holes (not shown) reaching the gate electrodes.

Wirings (including connecting wirings and signal lines) 5057 to 5062 and 5064 are obtained by patterning a laminate with a three-layer structure into a desired shape. The laminate consists of a Ti film with a thickness of 100 nm, a Ti-containing aluminum film with a thickness of 300 nm, and a Ti film with a thickness of 150 nm that are successively formed by sputtering. Other conductive films may of course be used.

The pixel electrode 5063 in this example is obtained by patterning an ITO film with a thickness of 110 nm. A contact is made by arranging the pixel electrode 5063 so as to touch the connection wiring line 5062. The pixel electrode may instead be formed of a transparent conductive film in which indium oxide is mixed with 2 to 20% zinc oxide (ZnO). The pixel electrode 5063 serves as an anode of an OLED. (FIG. 12A)

Next, as shown in FIG. 12B, an insulating film containing silicon (a silicon oxide film, in this embodiment) is formed to a thickness of 500 nm and an aperture is opened in the film at a position corresponding to the position of the pixel electrode 5063. A third interlayer insulating film 5065 functioning as a bank is thus formed. The aperture is formed using wet etching, thereby readily forming tapered sidewalls. If the side wall of the aperture is not smooth enough, the level difference can make degradation of an organic light emitting layer into a serious problem. Therefore attention must be paid.

An organic light-emitting layer 5066 and a cathode (MgAg electrode) 5067 are formed by vacuum evaporation successively without exposing the substrate to the air. The thickness of the organic light-emitting layer 5066 is set to 80 to 200 nm (typically 100 to 120 nm). The thickness of the cathode 5067 is set to 180 to 300 nm (typically 200 to 250 nm).

In this step, the organic light-emitting layer and the cathode are formed in a pixel for red light, then in a pixel for green light, and then in a pixel for blue light. The organic light-emitting layers have low resistivity to solutions, inhibiting the use of photolithography. Therefore, an organic light-emitting layer of one color cannot be formed together with an organic light-emitting layer of another color. Then organic light-emitting layers and cathodes are selectively formed in pixels of one color while covering pixels of the other two colors with a metal mask.

To elaborate, first, a mask that covers all the pixels except pixels for red light is set and the organic light emitting layers for emitting red light are selectively formed using the mask. Then a mask that covers all the pixels except pixels for green light is set and the organic light emitting layers for emitting green light are selectively formed using the mask. Lastly, a mask that covers all the pixels except pixels for blue light is set and the organic light emitting layers for emitting blue light are selectively formed using the mask. Although different masks are used in the description here, the same mask may be used three times for forming the organic light emitting layers of three colors.

Formed here are three types of OLED in accordance with R, O, and B. Instead, a white light emitting OLED combined with color filters, a blue light or bluish green light emitting element combined with fluorophors (fluorescent color conversion layers: CCM), or overlapped RGB OLED with a cathode (opposite electrode) formed of a transparent electrode may be used.

A known material can be used for the organic light emitting layer 5066. A preferable known material is an organic material, considering the driving voltage. For example, the organic light emitting layer has a four-layer structure consisting of a hole injection layer, a hole transporting layer, a light emitting layer, and an electron injection layer.

Next, a cathode 5067 is formed. In this embodiment, MgAg is used as the cathode 5067, however the present invention is not limited to this. Another known material can be used as the cathode 5067.

Finally, a passivation film 5068 made of a silicon nitride film is formed with a thickness of 300 nm. The formation of the passivation film 5068 enables the organic light emitting layer 5066 to be protected against moisture and the like, and the reliability of OLED can further be enhanced.

Consequently, the light emitting device with the structure as shown in FIG. 12B is completed. Note that, in the manufacturing process of the light emitting device in Embodiment 6, the source signal lines are formed from Ta and W, which are materials for forming the first gate electrode, and the first gate signal lines are formed from Al, which is a material for forming wirings, but different materials may be used.

Incidentally, the light emitting device in Embodiment 6 exhibits the very high reliability and has the improved operational characteristic by providing TFTs having the most suitable structure in not only the pixel portion 5100 but also the driver circuit portion 5101. Further, it is also possible to add a metallic catalyst such as Ni in the crystallization process, thereby increasing crystallinity. It therefore becomes possible to set the driving frequency of the source signal line driver circuit to 10 MHz or higher.

First, a TFT having a structure in which hot carrier injection is reduced without decreasing the operating speed as much as possible is used as an n-channel TFT 5102 of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 6, the active layer of the n-channel TFT contains the source region, the drain region, the LDD region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the p-channel TFT 5103 of the CMOS circuit, and therefore LDD regions may not be formed in particular. It is of course possible to form LDD regions similar to those of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as an example of such. Further, when a CMOS circuit in which it is necessary to suppress the value of the off current as much as possible is used, the n-channel TFT forming the CMOS circuit preferably has an Lov region. A circuit such as the transmission gate used in dot-sequential drive can be given as an example of such. In addition, in the pixel portion 5100 are formed a switching TFT 5104 and an EL driving TFT 5105.

Note that, in practice, it is preferable to perform packaging (sealing), without exposure to the atmosphere, using a protecting film (such as a laminated film or an ultraviolet cured resin film) having good airtight properties and little outgassing, or a transparent sealing material, after completing through the state of FIG. 12B. At this time, the reliability of OLED is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed.

Furthermore, in accordance with the process shown in Embodiment 6, the number of photo masks required for manufacture of a light emitting device can be suppressed. As a result, the process can be shortened, and the reduction of the manufacturing cost and the improvement of the yield can be attained.

Note that it is possible to implement Embodiment 6 in combination with Embodiments 1 to 5.

[Embodiment 7]

In this embodiment, an appearance of the light emitting device of the present invention is described with reference to FIGS. 13A to 13C.

Figure 13A:
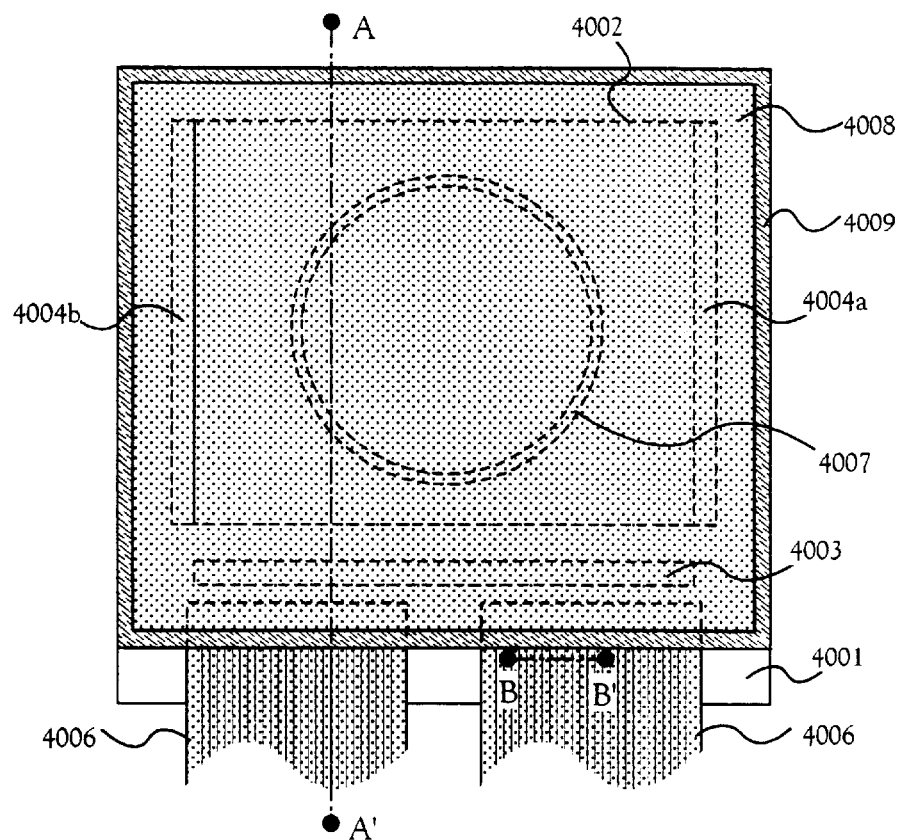
FIG. 13A showing a top view and FIGS. 13B and 13C showing sectional views of a light emitting device according to Embodiment 7.
Figure 13B:
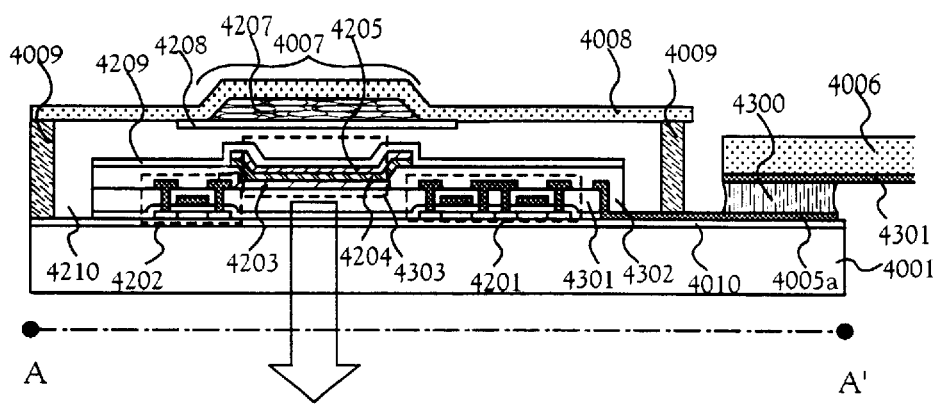
Figure 13C:
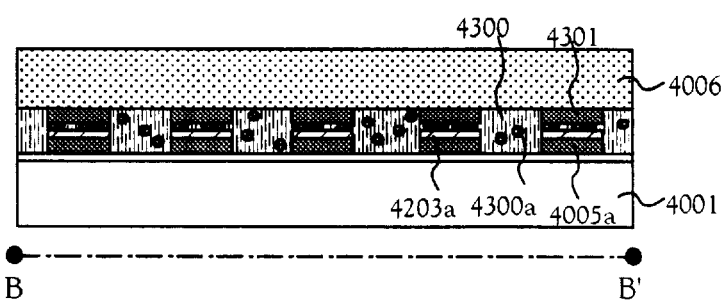
Figure 14:
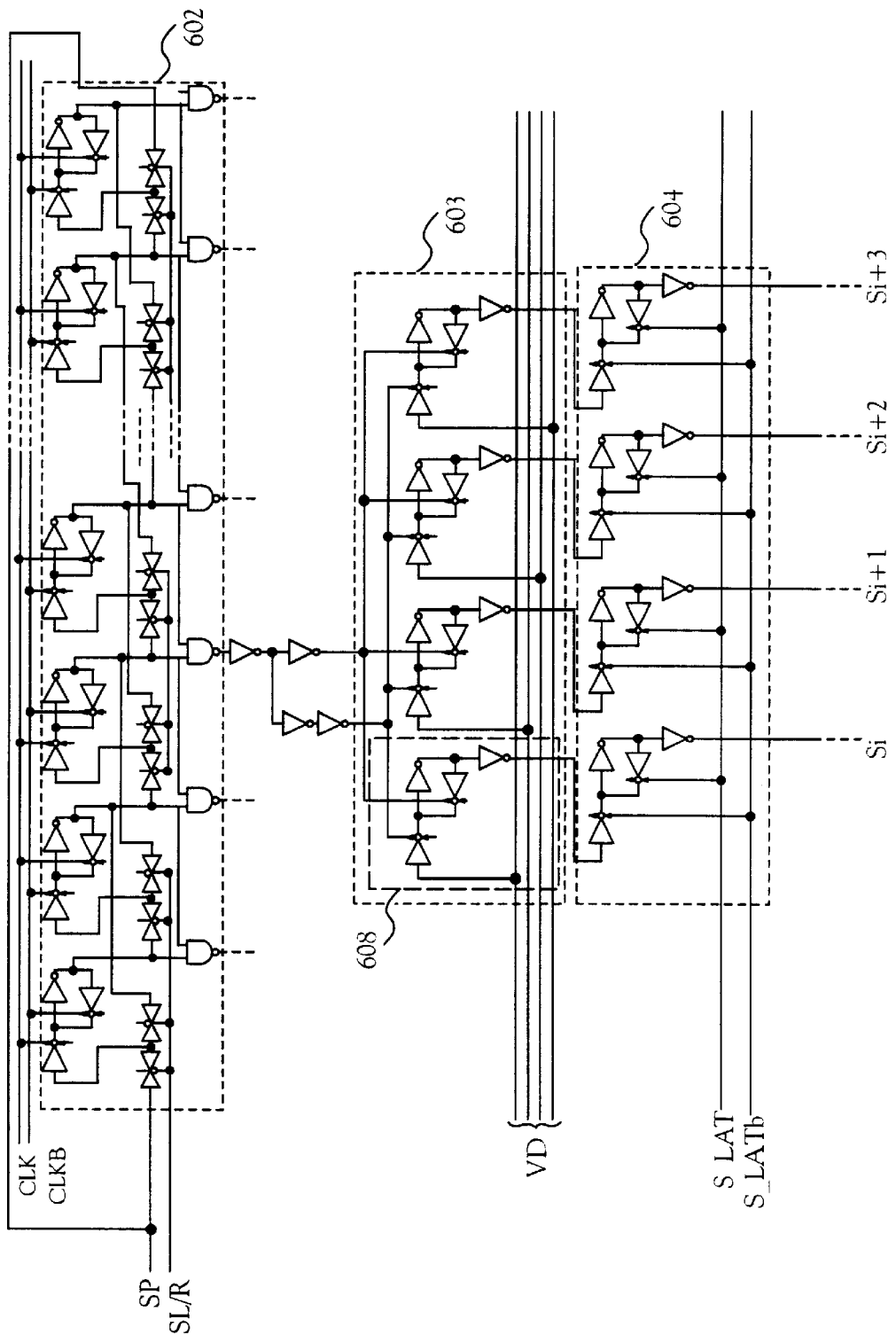
FIG. 14 is a circuit diagram of a source signal side driving circuit used in Embodiment 9.

FIG. 13A is a top view of the OLED panel formed by sealing the TFT substrate in which the pixel portion is formed, FIG. 13B is a cross sectional view taken along with a line A-A' of FIG. 13A, and FIG. 13C is a cross sectional view taken along with a line B-B' of FIG. 13A.

A seal member 4009 is provided so as to surround a display pixel portion 4002, a source line driver circuit 4003 and the first and the second gate line driver circuits 4004a and 4004b, which are provided on a substrate 4001. Further, a sealing material 4008 is provided on the display pixel portion 4002, the source line driver circuit 4003 and the first and the second gate line driver circuits 4004a and 4004b. Thus, the pixel portion 4002, the source line driver circuit 4003 and the first and the second gate line driver circuits 4004a and 4004b are sealed by the substrate 4001, the seal member 4009 and the sealing material 4008 together with a filler 4210.

Further, the pixel portion 4002, the source line driver circuit 4003 and the first and the second gate line driver circuits 4004a and 4004b, which are provided on the substrate 4001, have a plurality of TFTs. In FIG. 13B, a driver circuit TFT (Here, an n-channel TFT and a p-channel TFT are shown in the figure.) 4201 included in the source line driver circuit 4003 and the second TFT (TFT for controlling the current to the OLED) 4202 included in the pixel portion 4002, which are formed on a base film 4010, are typically shown.

In this embodiment, the p-channel TFT or the n-channel TFT manufactured by a known method is used as the driver circuit TFT 4201, and the p-channel TFT manufactured by a known method is used as the second TFT 4202. Further, the pixel portion 4002 is provided with a storage capacitor (not shown) connected to a gate of the second TFT 4202.

An interlayer insulating film (leveling film) 4301 is formed on the driver circuit TFT 4201 and the second TFT 4202, and a pixel electrode (anode) 4203 electrically connected to a drain of the second TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light emitting layer 4204 is formed on the pixel electrode 4203. A known organic light emitting material or inorganic light emitting material may be used for the organic light emitting layer 4204. Further, there exist a low molecular weight (monomer) material and a high molecular weight (polymer) material as the organic light emitting materials, and both the materials may be used. As a low molecular weight organic light emitting material $Alq_3$ (tris-8-quinolinolate aluminum) or TPD (tri-phenylamine derivative) can be used. As a polymer organic light emitting material, PPV (polyphenylene vinylene), PVK (polyvinylcarbazole), or polycarbonate can be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the above-described film deposition is enabled by using a multi-chamber type (cluster tool type) film forming device. In addition, a predetermined voltage is given to the cathode 4205.

As described above, OLED 4303 constituted of the pixel electrode (anode) 4203, the organic light emitting layer 4204 and the cathode 4205 is formed. Further, a protective film 4209 is formed on the insulating film 4302 so as to cover OLED 4303. The protective film 4209 is effective in preventing oxygen, moisture and the like from permeating OLED 4303.

Reference numeral 4005a denotes a wiring drawn to be connected to the power supply line, and the drawn wiring 4005a is electrically connected to a source region of the second TFT 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of OLED 4303 can be suppressed by providing the hygroscopic substance or the substance that can absorb oxygen 4207.

As shown in FIG. 13C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that this embodiment can be implemented by being freely combined with Embodiments 1 to 6.

[Embodiment 8]

In this embodiment, an external light emitting quantum efficiency can be remarkably improved by using an organic light emitting material by which phosphorescence from a triplet exciton can be employed for emitting a light. As a result, the power consumption of OLED can be reduced, the lifetime of the OLED can be elongated and the weight of the OLED can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

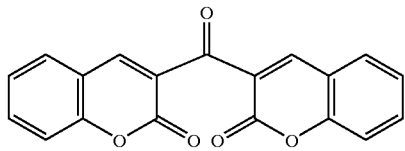

(M. A. Baldo, D. F. O'Brien, Y. You, A. Shoustikov, S. Sibley, M. E. Thompson, S. R. Forrest, Nature 395 (1998) p.151)

The molecular formula of an organic light emitting material (Pt complex) reported by the above article is represented as follows.

(Chemical formula 2)

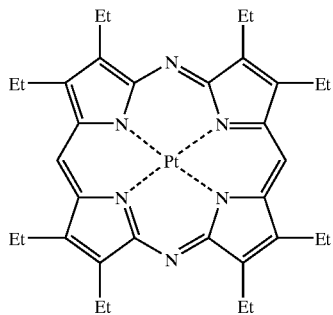

(M. A. Baldo, S. Lamansky, P. E. Burrows, M. E. Thompson, S. R. Forrest, Appl. Phys. Lett., 75 (1999) p.4.) (T. Tsutsui, M. J. Yang, M. Yahiro, K. Nakamura, T. Watanabe, T. Tsuji, Y. Fukuda, T. Wakimoto, S. Mavaguchi, Jpn. Appl. Phys., 38 (12B) (1999) L1502)

The molecular formula of an organic light emitting material (Ir complex) reported by the above article is represented as follows.

(Chemical formula 3)

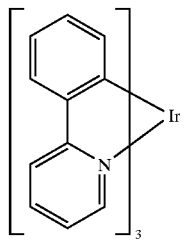

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 7.

[Embodiment 9]

An example of a circuit structure of the source signal side driver circuit 601 shown by FIG. 9 is explained in this embodiment.

In the source signal side driver circuit 601, shift registers 602, latches (A) 603, and latches (B) 604 are arranged as shown in figures. Note that one group of the latches (A) 603 and the latches (B) 604 corresponds to four source signal lines Si+1 to Si+3 in Embodiment 9. Further, a level shifter for changing the width of the amplitude of the signal voltage is not formed in this embodiment, but it may also he suitably formed by a designer.

A clock signal CK, a clock signal CKb in which the polarity of CK is inverted, a start pulse SP, and a driver direction changeover signal SL, R are each input to the shift registers 602 by wirings shown in figures. Further, a digital data signal VD input from the outside is input to the latches (A) 603 by wirings shown in figures. A latch signal S_LAT and a signal S_LATb, in which the polarity of S_LAT is inverted, are input to the latches (B) 604 by wirings shown in figures.

Regarding a detailed structure of the latches (A) 603, an example of a portion 608 of the latches (A) 603 that stores the digital data signal corresponding to the source signal line Si is explained. The portion 608 of the latches (A) 603 has two clocked invertors and two invertors.

Figure 15:
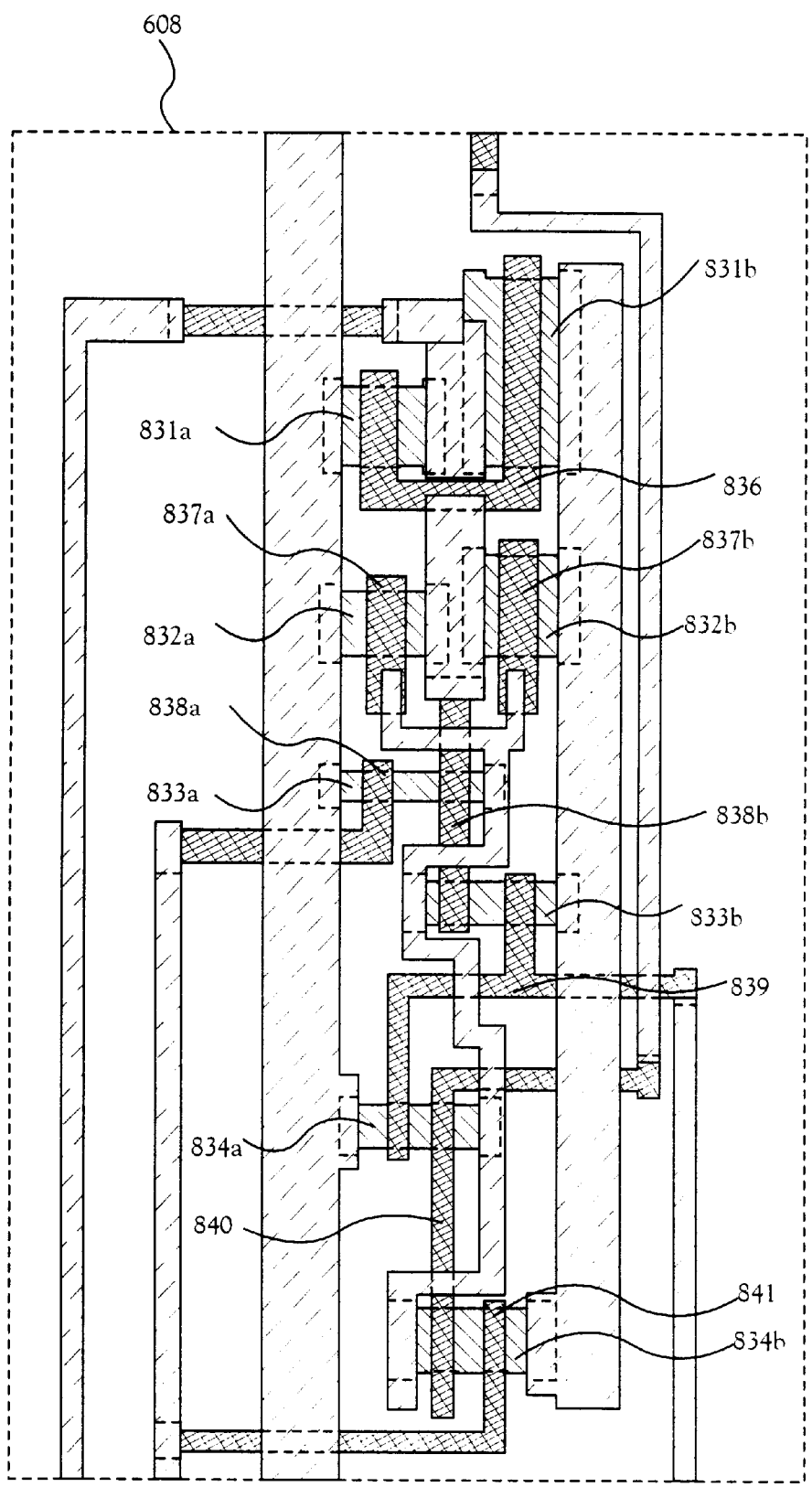
FIG. 15 is a top view of a latch circuit used in Embodiment 9.

A top view of the portion 608 of the latches (A) 603 is shown in FIG. 15. Reference numerals 831a and 831b each denotes an active layer of a TFT forming one inverter of the portion 608 of the latches (A) 603, and reference numeral 836 denotes a common gate electrode of the TFT forming one inverter. Further, reference numerals 832a and 832b each denotes an active layer of another TFT forming one inverter of the portion 608 of the latches (A) 603, and references numerals 837a and 837b denote gate electrodes formed on the active layers 832a and 832b, respectively. Note that the gate electrodes 837a and 837b are electrically connected.

Reference numerals 833a and 833b each denotes an active layer of a TFT forming one clocked inverter of the portion 608 of the latches (A) 604. Gate electrodes 838a and 838b are formed on the active layer 833a, becoming a double gate structure. Further, gate electrodes 838b and 839 are formed on the active layer 833b, becoming a double gate structure.

Reference numerals 834a and 834b each denotes an active layer of a TFT forming another clocked inverter of the portion 608 of the latches (A) 603. Gate electrodes 839 and 840 are formed on the active layer 834a, becoming a double gate structure. Further, gate electrodes 840 and 841 are formed on the active layer 834b, becoming a double gate structure.

The structure according to this embodiment can be freely implemented in combination of any structures of the Embodiments 1 to 8.

[Embodiment 10]

In Embodiment 10, the order of appearance of the display periods Tr1 to Tr6 is described in a driving method according to the present invention, which is adapted for a 6-bit digital video signal.

Figure 16:
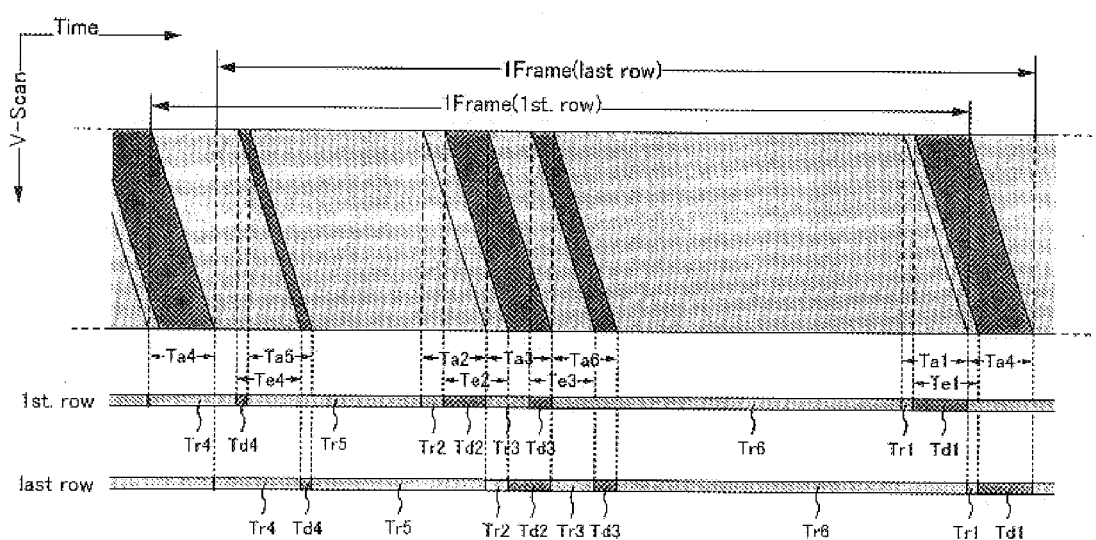
FIG. 16 is a timing chart showing a method of driving a light emitting device according to Embodiment 10.

FIG. 16 illustrates a timing chart of a driving method of Embodiment 10. In FIG. 16, the axis of abscissa indicates time and the axis of ordinate indicates a position of selected first gate signal line. The specific driving method is described in Embodiment mode, and thus, the description thereof is omitted here. In the driving method of Embodiment 10, a longest non-display period (Td1 in Embodiment 10) in one frame period is provided last in the one frame period. By this structure, human eyes visually perceive that there is a pause between the non-display period Td1 and the first display period of the next frame period (Tr4 in Embodiment 10). This makes it possible to make less recognizable to human eyes display unevenness caused due to adjacent display periods of light emission of adjacent frame periods when halftone display is carried out.

It is to be noted that, though, in this embodiment, the case of the 6-bit digital video signal is described, the present invention is not limited thereto. The present invention can be implemented without being limited by the number of bits of the digital video signal.

The structure according to this embodiment can be freely implemented in combination of any structures of the Embodiments 1 to 9.

[Embodiment 11]

Figure 17:
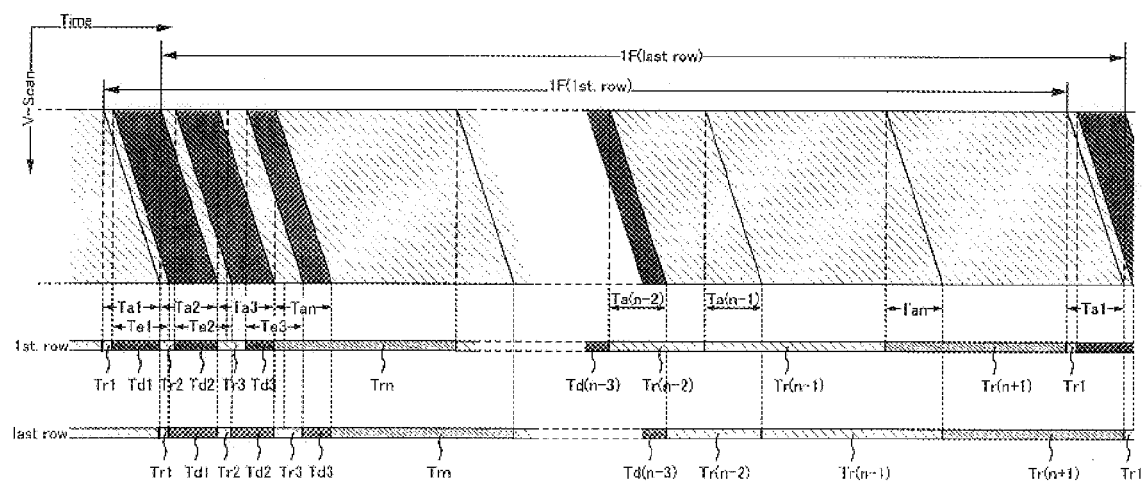
FIG. 17 is a timing chart showing a method of driving a light emitting device according to Embodiment 11.

A description is given with reference to FIG. 17 on a driving method using n-bit digital signals which is effective in avoiding false contour.

In FIG. 17, the axis of abscissa indicates time and the axis of ordinate indicates the position of the first gate signal line selected. For details about how pixels are driven, see Embodiment Mode.

In this embodiment, two display periods Trn and Tr (n+1) are provided for the n-th bit digital signal. These two display periods should not immediately follow each other and a display period for a digital signal of another bit is inserted between the two display periods.

The lengths of display periods are set to satisfy Tr1:Tr2:Tr3: . . . :Tr(n−1):(Trn+Tr(n+1))=$2^0:2^1:2^2:$ . . . : $2^{(n-2)}:2^{(n-1)}$. A desired gray scale out of 1 to $2^n$ gray scales can be obtained by combining the display periods.

When a pixel is to obtain an intermediate gray scale, the driving method of this embodiment raises the probability of alternating a display period in which the pixel emits light and a display period in which the pixel does not emit light in one frame period. Therefore the driving method of this embodiment less frequently allows human eyes to fixate only on pixels that do not emit light on the screen, or only on pixels that emit light, when the viewer let his or her eyes wander over the screen. Accordingly, the driving method can prevent display disturbance such as false contour, which is a noticeable disturbance in binary code time ratio driving, from being recognizable to the eye.

Although two display periods are provided for the n-th bit digital signal in this embodiment, this embodiment is not limited thereto. Three or more display periods may be provided for the n-th bit digital signal. Alternatively, a plurality of display periods may be provided for a digital signal of another bit. However, it is preferable to set plural display periods for a upper bit first and then for a lower bit. The number of division of display period can be determined at designer's discretion, but the balance between the driving speed of the display device and the image display quality required should be taken into consideration when deciding on how many.

A display period for a digital signal of one bit and a display period for the same bit desirably have the same length. However, the present invention is not limited thereto.

The structure of this embodiment can be combined with any of the structures of Embodiment 1 through 10.

[Embodiment 12]

This embodiment describes a composition of pixels in a light emitting device of the present invention that is different from that of Embodiment Mode.

Figure 18:
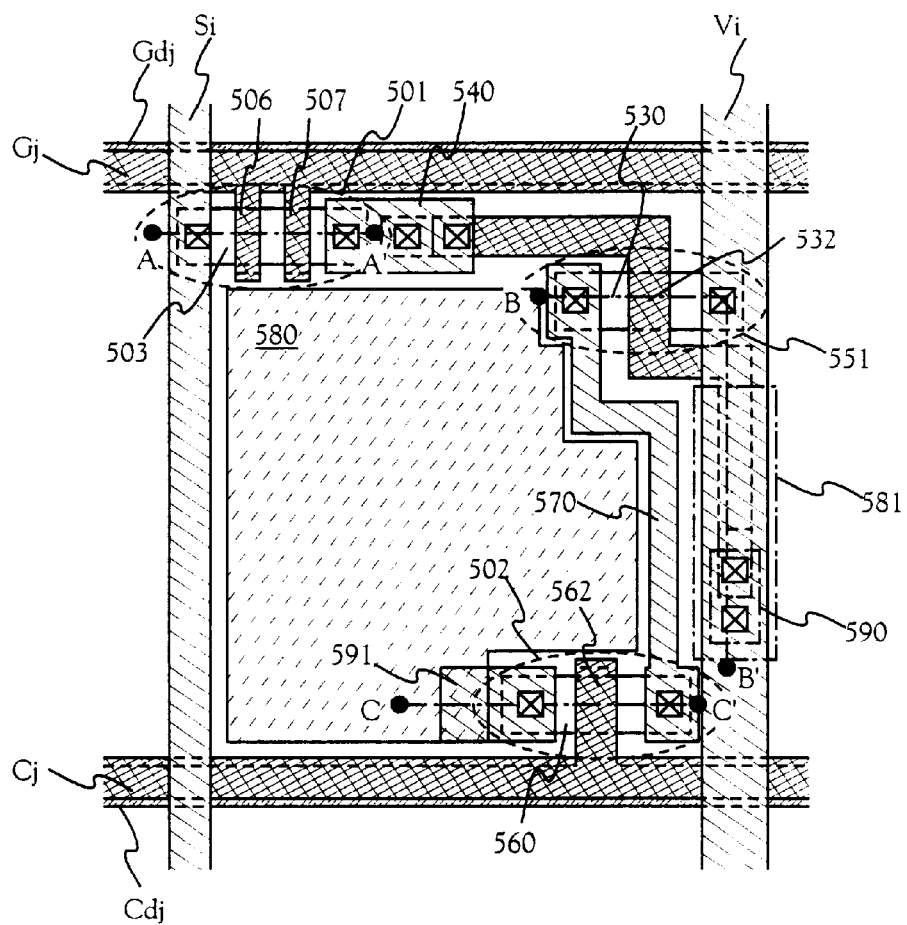
FIG. 18 is a top view of a pixel of a light emitting device according to Embodiment 12.
Figure 19A:
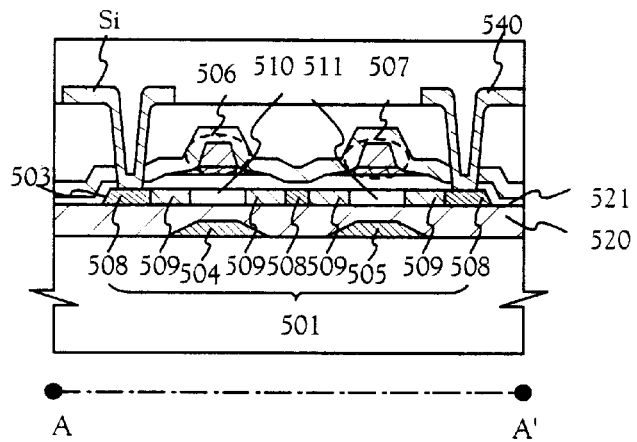
FIGS. 19A to 19C are sectional views of a pixel of a light emitting device according to Embodiment 12.
Figure 19B:
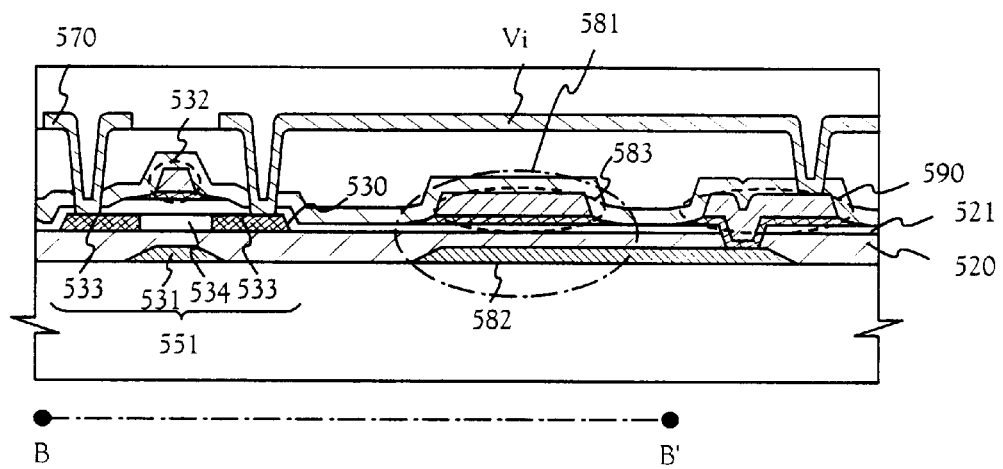
Figure 19C:
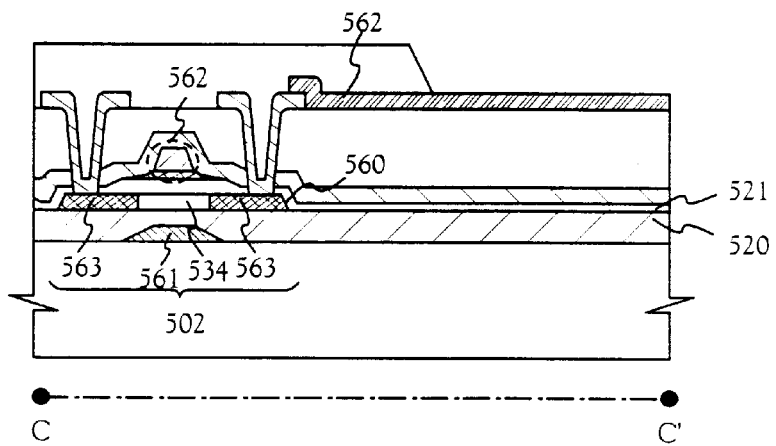

FIG. 18 is a top view of a pixel of a light emitting device according to this embodiment. In FIG. 18, an organic light emitting layer and cathode that are formed in steps subsequent to a step of forming a pixel electrode are omitted so that the structure of the pixel is understood more easily. A sectional view taken along the line A-A' in FIG. 18 is shown in FIG. 19A, a sectional view taken along the line B-B' in FIG. 18 is shown in FIG. 19B, and a sectional view taken along the line C-C' in FIG. 18 is shown in FIG. 19C.

A first TFT 501 is an n-channel TFT, a second TFT 551 is a p-channel TFT, and a third TFT 502 is a p-channel TFT.

The first TFT 501 has a semiconductor film 503, a first insulating film 520, first electrodes 504 and 505, a second insulating film 521, and second electrodes 506 and 507. The semiconductor film 503 has first concentration one conductivity type impurity regions 508, second concentration one conductivity type impurity regions 509, and channel formation regions 510 and 511.

The first electrodes 504 and 505 respectively overlap the channel formation regions 510 and 511 with the first insulating film 520 interposed therebetween. The second electrodes 506 and 507 respectively overlap the channel formation regions 510 and 511 with the second insulating film 521 interposed therebetween.

Of the two first concentration one conductivity type impurity regions 508, one is connected to a source signal line Si and the other is connected to a wiring line 540.

The first electrodes 504 and 505 are a part of a first gate signal line Gj and the second electrodes 506 and 507 are a part of a first lower layer wiring line Gdj.

The second TFT 551 has a semiconductor film 530, the first insulating film 520, a first electrode 531, the second insulating film 521, and a second electrode 532. The semiconductor film 530 has third concentration one conductivity type impurity regions 533 and a channel formation region 534.

The first electrode 531 overlaps the channel formation region 534 with the first insulating film 520 interposed therebetween. The second electrode 532 overlaps the channel formation region 534 with the second insulating film 521 interposed therebetween.

Of the two third concentration one conductivity type impurity regions 533, one is connected to a power supply line Vi and the other is connected to a wiring line 570.

The first electrode 531 is electrically connected to the second electrode 532 through the wiring line 540.

The third TFT 502 has a semiconductor film 560, the first insulating film 520, a first electrode 561, the second insulating film 521, and a second electrode 562. The semiconductor film 560 has third concentration one conductivity type impurity regions 563 and a channel formation region 564.

The first electrode 561 overlaps the channel formation region 564 with the first insulating film 520 interposed therebetween. The second electrode 562 overlaps the channel formation region 564 with the second insulating film 521 interposed therebetween.

Of the two third concentration one conductivity type impurity regions 563, one is connected to a pixel electrode 580 of OLED via a wiring line 591 and the other is connected to a wiring line 570.

The first electrode 561 is a part of a second gate signal line Cj and the second electrode 562 is a part of a second lower layer wiring line Cdj.

Denoted by 582 is a first wiring line for capacitance which is electrically connected to the first electrode 531 of the second TFT 551. 583 denotes a second wiring line for capacitance which is electrically connected to the second electrode 532 of the second TFT 551. The first wiring line 582 and the second wiring line 583 overlap each other with the first insulating film 520 and the second insulating film 521 interposed therebetween. The power supply line Vi and the first wiring line 582 are connected to a wiring line 590 that is formed at the same time the second wiring line 583 is formed. The power supply line Vi is electrically equivalent to the first wiring line 582. A region where the first wiring line 582, the second wiring line 583, the first insulating film 520, and the second insulating film 521 overlap one another corresponds to a capacitor 581. In this way, a larger capacitance can be formed using the insulating films between the first electrode and the second electrode. This structure is applicable not only to a pixel but also to other circuits.

In this embodiment, voltages applied to the first TFT 501 and third TFT 502 that are used as switching elements are close to the threshold voltage of the first electrodes and are kept constant. By applying a constant voltage close to the threshold voltage to a first electrode, fluctuation in threshold can be reduced and OFF current is lowered compared to the case where there is only one electrode.

In the second TFT 551 which is required to let a larger amount of current to flow than a TFT used as a switching element, the first gate electrode is electrically connected to the second electrode. The same level of voltage is applied to the first electrode and the second electrode to make the depletion layer spread fast as if the semiconductor film is actually thinned. Therefore, the sub-threshold coefficient can be reduced and the field effect mobility can be improved. This makes the ON current of the second TFT larger compared to the case where there is only one electrode. Accordingly, the driving voltage can be lowered in a driving circuit that employs a TFT of this structure. Moreover, an increase in ON current leads to a reduction in size (channel width, in particular) of TFT. Therefore, the integration density can be improved.

A TFT having its first electrode and second electrode electrically connected to each other as the second TFT 551 of this embodiment can obtain a relatively high ON current. Therefore such TFT is suitable to control the voltage applied to a driving circuit, especially to a source signal line and first and second gate signal lines.

Note that the structure of this embodiment can be freely combined with any of the structures of Embodiment 1 through 11.

[Embodiment 13]

Since the light emitting device is a self light emission type, this light emitting device has high visibility in a light place and a wide view angle, compared to the liquid crystal display devices. Therefore, this light emitting device can be used as a display portion of various electronic equipment.

Given as such electronic equipment of the light emitting device of the present invention are video cameras, digital cameras, goggle type displays (head mounted displays), car navigation systems, audio playback devices (car audio, audio component, and the like) notebook computers, game machines, portable information terminals (mobile computers, cellular phones, portable game machines, electronic books or the like), image playback devices with the recording medium (specifically, the devices with such display as playbacks the recording medium (digital versatile disc (DVD), and the like) and displays the image thereof. In particular, as for the portable information terminal, since the user is likely to see its screen from a slant direction, emphasis is laid on a wide view angle. Therefore, the light emitting devices is preferably used therefore. Specific examples of those are shown in FIG. 20.

Figure 20A:
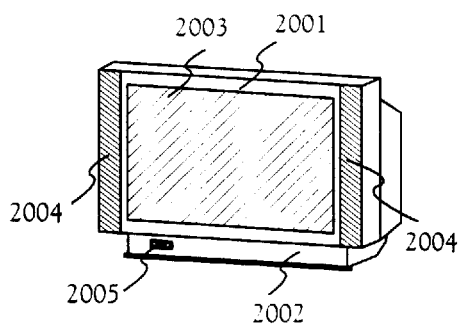
FIGS. 20A to 20H are diagrams of electronic equipment that employ a light emitting device of Embodiment 13.

FIG. 20A shows a display device which is composed of housing 2001, a supporting base 2002, a display portion 2003, a speaker portion 2004, a video input terminal 2005. The light emitting devices of the present invention can be applied to the display portion 2003, and thus, the display device of the present invention is completed. Since the light emitting device is a self light emitting type, the back light is unnecessary. As a result, the display portion that is thinner than that of the liquid crystal display device can be obtained. It is to be noted that the display device includes all the information display devices to be incorporated in a personal computer, a receiver for TV broadcasting, a display for advertisement, and the like.

Figure 20B:
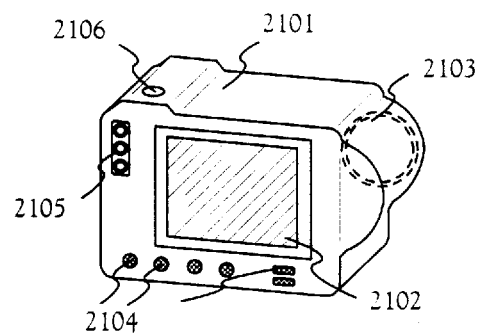

FIG. 20B shows a digital still camera which is composed of a main body 2101, a display portion 2102, image receiving portion 2103, an operation key 2104, an exterior connection portion 2105, a shutter 2106, and the like. The light emitting devices of the present invention can be applied to the display portion 2102, and thus, the digital still camera of the present invention is completed.

Figure 20C:
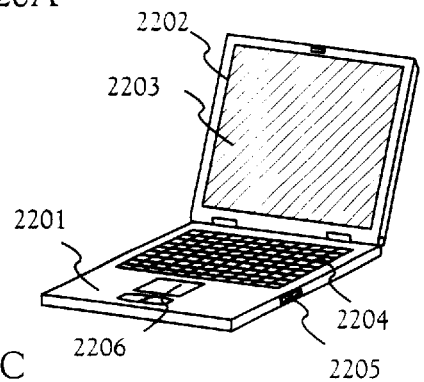

FIG. 20C shows a note computer which is composed of a main body 2201, housing 2202, a display portion 2203, a key board 2204, an exterior connection port 2205, and a pointing mouse 2206, and the like. The light emitting devices of the present invention can be applied to the display portion 2203.

Figure 20D:
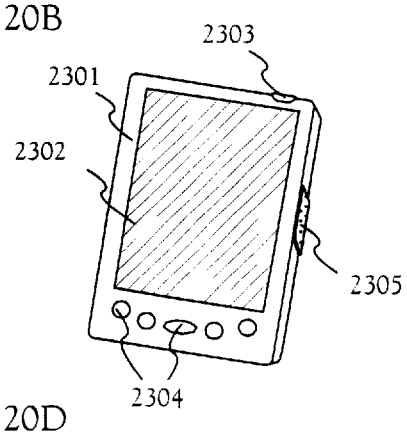

FIG. 20D shows a mobile computer which shows a main body 2301, a display portion 2302, a switch 2303, an operation key 2304, an infrared port 2305, and the like. The light emitting devices of the present invention can be applied to the display portion 2302, and thus, the mobile computer is completed.

Figure 20E:
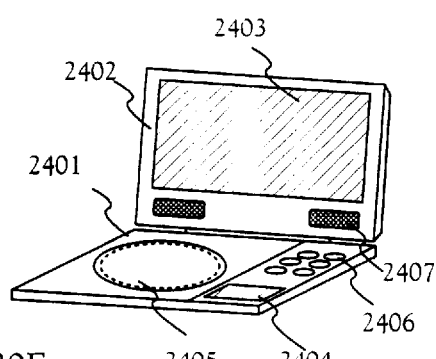

FIG. 20E shows a portable image playback device with a recording medium (specifically, a DVD playback device), which is composed of a main body 2401, housing 2402, a display portion A 2403, a display portion B 2404, a recording medium (DVD, etc.) reading portion 2405, an operation key 2406, a speaker portion 2407, and the like. The display portion A 2403 mainly displays image information, and the display portion B 2404 mainly displays letter information. The light emitting device of the present invention can be applied to the display portion A 2403 and B 2404. The image playback device with the recording medium is incorporated to the domestic game machines. The light emitting devices of the present invention can be applied to the display potions A 2403 and B 2404, and thus, the portable image playback device is completed.

Figure 20F:
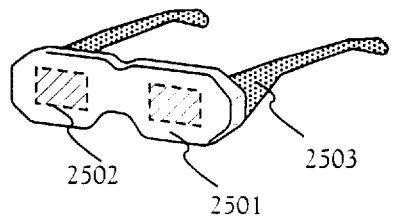

FIG. 20F shows a goggle type displays (head mounted displays) which is composed of a main body 2501, an display portion 2502, and an arm portion 2503. The light emitting devices of the present invention can be applied to the display portion 2502, and thus, the goggle type displays of the present invention is completed.

Figure 20G:
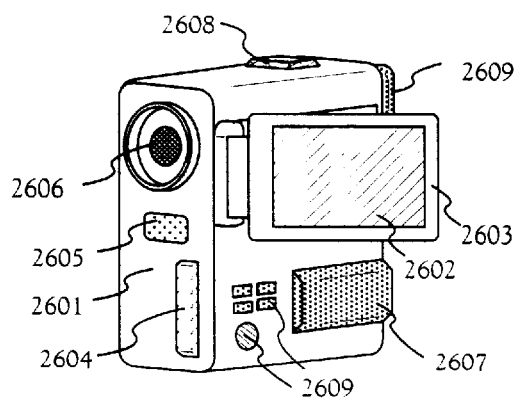

FIG. 20G shows a video camera which is composed of a main body 2601, a display portion 2602, housing 2603, an exterior connection portion 2604, a remote control receiving portion 2605, an image receiving portion 2606, a battery 2607, an audio input portion 2608, an operation key 2609, and the like. The light emitting devices of the present invention can be applied to the display portion 2602, and thus, the video camera of the present invention is completed.

Figure 20H:
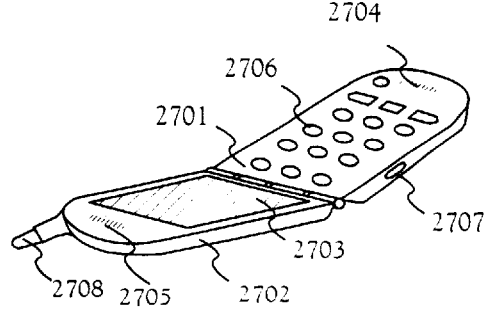
Figure 21:
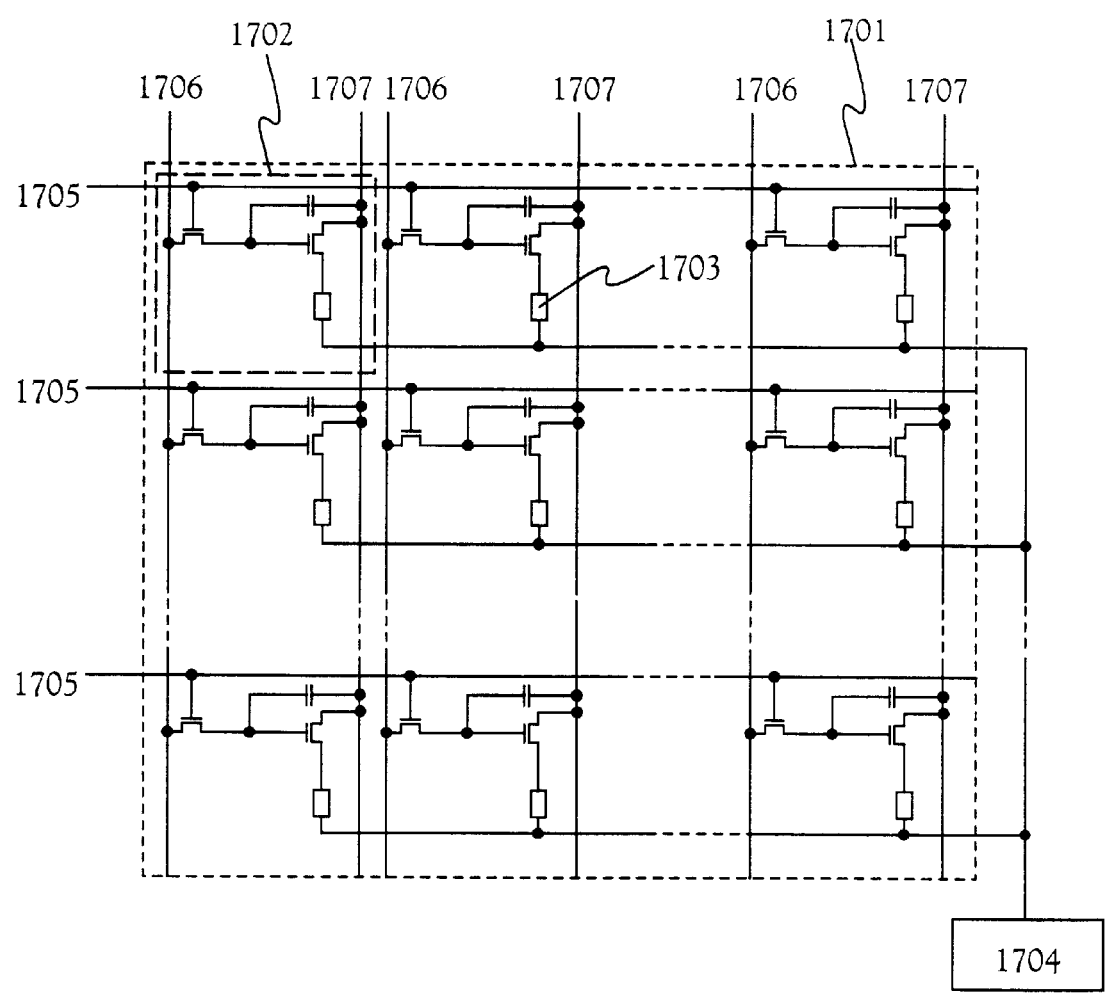
FIG. 21 is a circuit diagram of a pixel portion of a conventional light emitting device.
Figure 22:
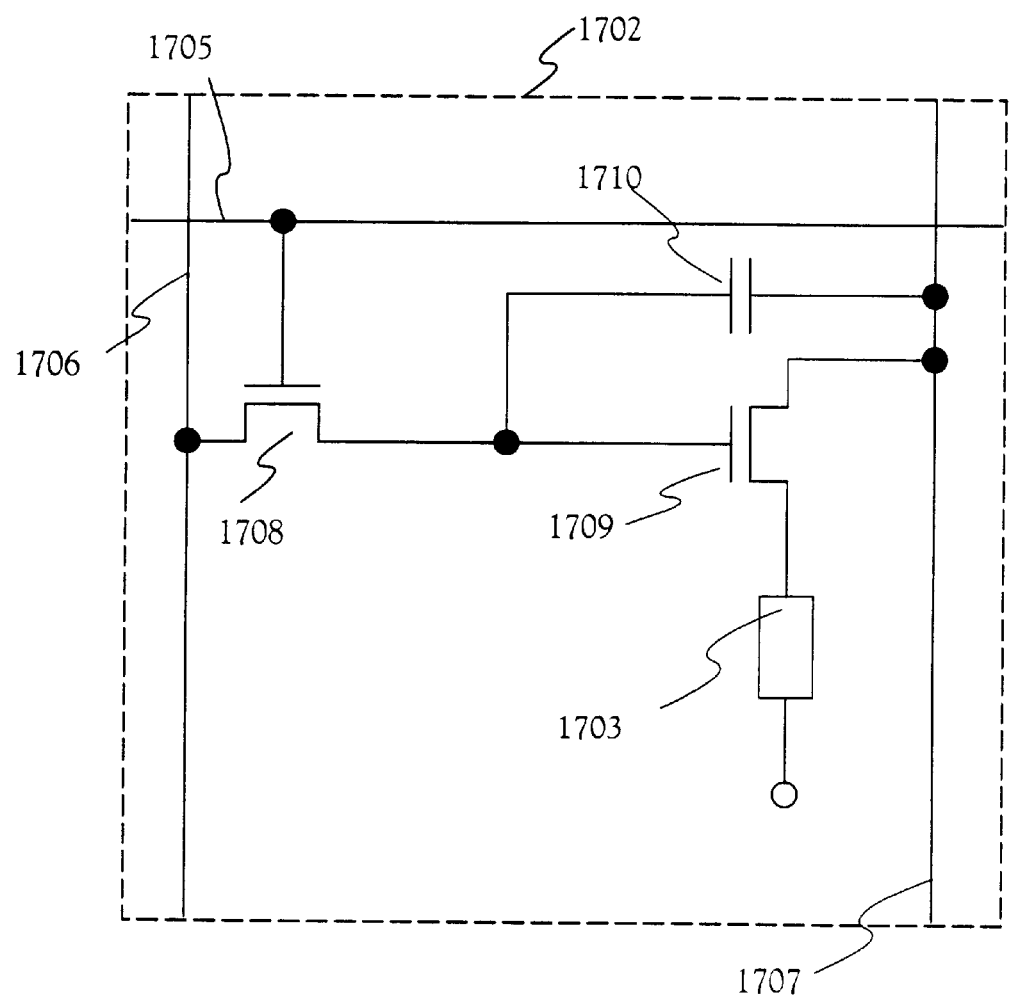
FIG. 22 is a circuit diagram of a pixel of a conventional light emitting device.

FIG. 20H shows a cellular phone which is composed of a main body 2701, housing 2702, a display portion 2703, an audio input portion 2704, an audio output portion 2705, an operation key 2706, an exterior connection port 2707, an antenna 2708, and the like. The light emitting devices of the present invention can be applied to the display portion 2703, and thus, the cellular phone of the present invention is completed. In addition, the display portion 2703 can reduce power consumption of the cellular phone by displaying white letters on the black display.

Note that, if the light emitting luminance of the organic light emitting material becomes higher in the future, it is possible to use the organic light emitting material to a front type of a rear type projector by magnifying and projecting the light that includes outputted image information with lens etc.

Further, the electronic equipment described above are most likely used for displaying information distributed via electronic communications lines such as Internet and a cable television (CATV). In particular, opportunities are increased in which moving information are displayed. Since the response speed of the organic light emitting material is extremely high, the light emitting device is preferably used for displaying motion pictures.

As described above, the application range of the present invention is so wide that it is applicable to electronic equipment of every field. The electronic equipment of this embodiment can be obtained by any structure resulting from combinations of Embodiments 1 to 12.

With the above structure, the present invention can control the OLED drive voltage while giving an opposite electrode of an OLED a constant voltage. Accordingly, a light emitting device of the present invention does not need a switch of a power supply that controls the opposite electrode voltage and, if it has the switch, the current capacity required of the light emitting device is not high.

Also, enlargement of the light emitting device is not hindered by upper limit in current capacity of the switch of the power supply for the opposite electrode. Moreover, only a small amount of current flows into the switch of the power supply for the opposite electrode and therefore lowering of frequency characteristic of a driving circuit due to the switch can be avoided to prevent reduction in number of gray scales.

What is claimed is:

1. A light emitting device comprising a plurality of pixels, each of the plurality of pixels including:
   a first thin film transistor including a first source region, a first drain region and a first gate electrode;
   a second thin film transistor including a second source region, a second drain region and a second gate electrode;
   a third thin film transistor including a third source region, a third drain region and a third gate electrode;
   a light emitting element including a pixel electrode;
   a first wiring; and
   a second wiring;
   wherein one of the first source and drain regions of the first thin film transistor is electrically connected to the second gate electrode of the second thin film transistor while the other of the first source and drain regions is electrically connected to the first wiring,
   wherein one of the second source and drain regions of the second thin film transistor is electrically connected to the second wiring while the other of the second source and drain regions of one of the third source and drain regions of the third thin film transistor,
   wherein the other of the third source and drain regions of the third thin film transistor is electrically connected to the pixel electrode of the light emitting element,
   wherein first gate electrodes of first thin film transistors in the plurality of pixels are electrically connected each other,
   wherein third gate electrodes of third thin film transistors in the plurality of pixels are electrically connected each other.

2. A device according to claim 1,
wherein the second and third thin film transistors have a same polarity.

3. A device according to claim 1,
wherein the pixel electrode is an anode,
wherein the third thin film transistor is a p-channel thin film transistor.

4. A device according to claim 1,
wherein the pixel electrode is a cathode,
wherein the third thin film transistor is an n-channel thin film transistor.

5. A device according to claim 1,
wherein the light emitting element includes an organic light emitting layer,
wherein the organic light emitting layer comprises at least one selected from the group consisting of a low molecular weight material and a polymer material.

6. A device according to claim 5,
wherein the low molecular weight material comprises at least one selected from the group consisting of Alq$_3$ (tris-8-quinolinolate aluminum) and TPD (triphenylamine derivative).

7. A device according to claim 5,
wherein the polymer material comprises at least one selected from the group consisting of PPV (polyphenylene vinylene), PVK (polyvinylcarbazole) and polycarbonate.

8. A device according to claim 1,
wherein the light emitting device is in combination with an electronic equipment,
wherein the electronic equipment is one selected from the group consisting of a display device, a digital still camera, a note computer, a mobile computer, a portable image playback device with a recording medium, a goggle type display, a video camera and a cellular phone.

9. A light emitting device comprising:
a plurality of pixels, each of the plurality of pixels including:
   a first thin film transistor including a first source region, a first drain region and a first gate electrode;
   a second thin film transistor including a second source region, a second drain region and a second gate electrode;
   a third thin film transistor including a third source region, a third drain region and a third gate electrode;
   a light emitting element including a pixel electrode;
   a first wiring; and
   a second wiring;
a third wiring; and
a fourth wiring;
wherein one of the first source and drain regions of the first thin film transistor is electrically connected to the second gate electrode of the second thin film transistor while the other of the first source and drain regions is electrically connected to the first wiring,
wherein one of the second source and drain regions of the second thin film transistor is electrically connected to the second wiring while the other of the second source and drain regions is electrically connected to one of the third source and drain regions of the third thin film transistor,
wherein the other of the third source and drain regions of the third thin film transistor is electrically connected to the pixel electrode of the light emitting element,
wherein first gate electrodes of first thin film transistors in the plurality of pixels are electrically connected to the third wiring,
wherein third gate electrodes of third thin film transistors in the plurality of pixels are electrically connected to the fourth wiring.

10. A device according to claim 9,
wherein the second and third thin film transistors have a same polarity.

11. A device according to claim 9,
wherein the pixel electrode is an anode,
wherein the third thin film transistor is a p-channel thin film transistor.

12. A device according to claim 9,
wherein the pixel electrode is a cathode,
wherein the third thin film transistor is an n-channel thin film transistor.

13. A device according to claim 9,
wherein the light emitting element includes an organic light emitting layer,
wherein the organic light emitting layer comprises at least one selected from the group consisting of a low molecular weight material and a polymer material.

14. A device according to claim 13,
wherein the low molecular weight material comprises at least one selected from the group consisting of $Alq_3$ (tris-8-quinolinolate aluminum) and TPD (triphenylamine derivative).

15. A device according to claim 13,
wherein the polymer material comprises at least one selected from the group consisting of PPV (polyphenylene vinylene), PVK (polyvinylcarbazole) and polycarbonate.

16. A device according to claim 9,
wherein the light emitting device is in combination with an electronic equipment,
wherein the electronic equipment is one selected from the group consisting of a display device, a digital still camera, a note computer, a mobile computer, a portable image playback device with a recording medium, a goggle type display, a video camera and a cellular phone.

17. A light emitting device comprising a plurality of pixels, each of the plurality of pixels including:
a first thin film transistor including a first source region, a first drain region and a first gate electrode;
a second thin film transistor including a second source region, a second drain region and a second gate electrode;
a third thin film transistor including a third source region, a third drain region and a third gate electrode;
a light emitting element including a pixel electrode;
a first wiring;
a second wiring;
wherein one of the first source and drain regions of the first thin film transistor is electrically connected to the second gate electrode of the second thin film transistor while the other of the first source and drain regions is electrically connected to the first wiring,
wherein one of the second source and drain regions of the second thin film transistor is electrically connected to the pixel electrode of the light emitting element while the other of the second source and drain regions is electrically connected to one of the third source and drain regions of the third thin film transistor,
wherein the other of the third source and drain regions of the third thin film transistor is electrically connected to the second wiring,
wherein first gate electrodes of first thin film transistors in the plurality of pixels are electrically connected each other,
wherein third gate electrodes of third thin film transistors in the plurality of pixels are electrically connected each other.

18. A device according to claim 17,
wherein the second and third thin film transistors have a same polarity.

19. A device according to claim 17,
wherein the pixel electrode is an anode,
wherein the third thin film transistor is a p-channel thin film transistor.

20. A device according to claim 17,
wherein the pixel electrode is a cathode,
wherein the third thin film transistor is an n-channel thin film transistor.

21. A device according to claim 17,
wherein the light emitting element includes an organic light emitting layer,
wherein the organic light emitting layer comprises at least one selected from the group consisting of a low molecular weight material and a polymer material.

22. A device according to claim 21,
wherein the low molecular weight material comprises at least one selected from the group consisting of $Alq_3$ (tris-8-quinolinolate aluminum) and TPD (triphenylamine derivative).

23. A device according to claim 21,
wherein the polymer material comprises at least one selected from the group consisting of PPV (polyphenylene vinylene), PVK (polyvinylcarbazole) and polycarbonate.

24. A device according to claim 17,
wherein the light emitting device is in combination with an electronic equipment,
wherein the electronic equipment is one selected from the group consisting of a display device, a digital still camera, a note computer, a mobile computer, a portable image playback device with a recording medium, a goggle type display, a video camera and a cellular phone.

25. A light emitting device comprising:
a plurality of pixels, each of the plurality of pixels including:
a first thin film transistor including a first source region, a first drain region and a first gate electrode;
a second thin film transistor including a second source region, a second drain region and a second gate electrode;
a third thin film transistor including a third source region, a third drain region and a third gate electrode;
a light emitting element including a pixel electrode;
a first wiring; and
a second wiring;
a third wiring; and
a fourth wiring;
wherein one of the first source and drain regions of the first thin film transistor is electrically connected to the second gate electrode of the second thin film transistor while the other of the first source and drain regions is electrically connected to the first wiring,
wherein one of the second source and drain regions of the second thin film transistor is electrically connected to the pixel electrode of the light emitting element while the other of the second source and drain regions is electrically connected to one of the third source and drain regions of the third thin film transistor, wherein the other of the third source and drain regions of the third thin film transistor is electrically connected to the second wiring, wherein first gate electrodes of first thin film transistors in the plurality of pixels are electrically connected to the third wiring, wherein third gate electrodes of third thin film transistors in the plurality of pixels are electrically connected to the fourth wiring.

26. A device according to claim 25,
wherein the second and third thin film transistors have a same polarity.

27. A device according to claim 25,
wherein the pixel electrode is an anode,
wherein the third thin film transistor is a p-channel thin film transistor.

28. A device according to claim 25,
wherein the pixel electrode is a cathode,
wherein the third thin film transistor is an n-channel thin film transistor.

29. A device according to claim 25,
wherein the light emitting element includes an organic light emitting layer,
wherein the organic tight emitting layer comprises at least one selected from the group consisting of a low molecular weight material and a polymer material.

30. A device according to claim 29,
wherein the low molecular weight material comprises at least one selected from the group consisting of $Alq_3$ (tris-8-quinolinolate aluminum) and TPD (triphenylamine derivative).

31. A device according to claim 29,
wherein the polymer material comprises at least one selected from the group consisting of PPV (polyphenylene vinylene), PVK (polyvinylcarbazole) and polycarbonate.

32. A device according to claim 25,
wherein the light emitting device is in combination with an electronic equipment,
wherein the electronic equipment is one selected from the group consisting of a display device, a digital still camera, a note computer, a mobile computer, a portable image playback device with a recording medium, a goggle type display, a video camera and a cellular phone.

33. A method of driving a light emitting device,
said light emitting device comprising a plurality of pixels, each of the plurality of pixels including:
a first thin film transistor;
a second thin film transistor;
a third thin film transistor;
a light emitting element including a pixel electrode;
wherein one frame period includes a display period and a non display period;
said method comprising:
inputting one bit digital signal into a gate electrode of the second thin film transistor through the first thin film transistor and flowing a drain current of the second thin film transistor into the pixel electrode of the light emitting element through the third thin film transistor,
wherein the third thin film transistor turns off in the non display period.

34. A method according to claim 33,
wherein the one frame period is 1/60 second or less.

35. A method according to claim 33,
wherein the light emitting device is in combination with an electronic equipment,
wherein the electronic equipment is one selected from the group consisting of a display device, a digital still camera, a note computer, a mobile computer, a portable image playback device with a recording medium, a goggle type display, a video camera and a cellular phone.

36. A method of driving a light emitting device,
said light emitting device comprising a plurality of pixels, each of the plurality of pixels including:
a first thin film transistor;
a second thin film transistor;
a third thin film transistor;
a light emitting element including a pixel electrode;
wherein one frame period includes a plurality of display periods and a plurality of non display periods;
said method comprising:
inputting one bit of n bits digital signals into a gate electrode of the second thin film transistor through the first thin film transistor and flowing a drain current of the second thin film transistor into the pixel electrode of the light emitting element through the third thin film transistor,
wherein the third thin film transistor turns off in each of the plurality of non display periods,
wherein a ratio of lengths of the display periods corresponding to the display periods is $2^0:2^1:2^2: \ldots :2^{(n-2)}:2^{(n-1)}$.

37. A method according to claim 36,
wherein the one frame period is 1/60 second or less.

38. A method according to claim 36,
wherein the light emitting device is in combination with an electronic equipment,
wherein the electronic equipment is one selected from the group consisting of a display device, a digital still camera, a note computer, a mobile computer, a portable image playback device with a recording medium, a goggle type display, a video camera and a cellular phone.

* * * * *